(12) United States Patent
Stevenson

(10) Patent No.: US 8,351,887 B2
(45) Date of Patent: Jan. 8, 2013

(54) SYSTEMS AND METHODS PROVIDING MULTI-PATH LOW NOISE AMPLIFIERS WITH SEAMLESS SWITCHING

(75) Inventor: Jan-Michael Stevenson, Frisco, TX (US)

(73) Assignee: CSR Technology, Inc., Sunnyvale, CA (US)

( * ) Notice: Subject to any disclaimer, the term of this patent is extended or adjusted under 35 U.S.C. 154(b) by 414 days.

(21) Appl. No.: 12/632,648

(22) Filed: Dec. 7, 2009

(65) Prior Publication Data

US 2011/0133833 A1    Jun. 9, 2011

(51) Int. Cl.
*H04B 7/00*    (2006.01)

(52) U.S. Cl. ............... 455/234.1; 455/232.1; 455/239.1; 455/250.1; 330/124 R; 330/254; 330/278

(58) Field of Classification Search ............... 455/234.1, 455/232.1, 232.2, 239.1, 250.1, 234, 250.11; 330/124 R, 254, 278
See application file for complete search history.

(56) References Cited

U.S. PATENT DOCUMENTS

| | | | |
|---|---|---|---|
| 6,064,265 A | 5/2000 | Yun et al. | |
| 6,445,251 B1 | 9/2002 | Robinson | |
| 6,710,659 B2 * | 3/2004 | Teramoto et al. | 330/254 |
| 6,719,659 B2 * | 4/2004 | Geiberger et al. | 475/216 |
| 7,250,814 B2 * | 7/2007 | Bardsley et al. | 330/51 |
| 7,403,071 B2 | 7/2008 | Hollenbeck et al. | |
| 7,504,885 B2 * | 3/2009 | Oba et al. | 330/284 |
| 2008/0233913 A1 | 9/2008 | Sivasubramaniam | |

OTHER PUBLICATIONS

International Search Report and the Written Opinion issued for PCT/US2010/059111, dated Feb. 3, 2011, 7 pages.

\* cited by examiner

*Primary Examiner* — Sanh Phu
(74) *Attorney, Agent, or Firm* — Fulbright & Jaworski L.L.P.

(57) ABSTRACT

Systems and methods which provide a multimode tuner architecture implementing direct frequency conversion are shown. Embodiments provide a highly integrated configuration wherein low noise amplifier, tuner, analog and digital channel filter, and analog demodulator functionality are provided in a single integrated circuit. A LNA of embodiments implements a multi-path configuration with seamless switching to provide desired gain control while meeting noise and linearity design parameters. Embodiments of the invention implement in-phase and quadrature (IQ) equalization and a multimode channelization filter architecture to facilitate the use of direct frequency conversion. Embodiments implement spur avoidance techniques for improving tuner system operation and output using a clock signal generation architecture in which a system clock, sampling clock frequencies, local oscillator (LO) reference clock frequencies, and/or the like are dynamically movable.

16 Claims, 18 Drawing Sheets

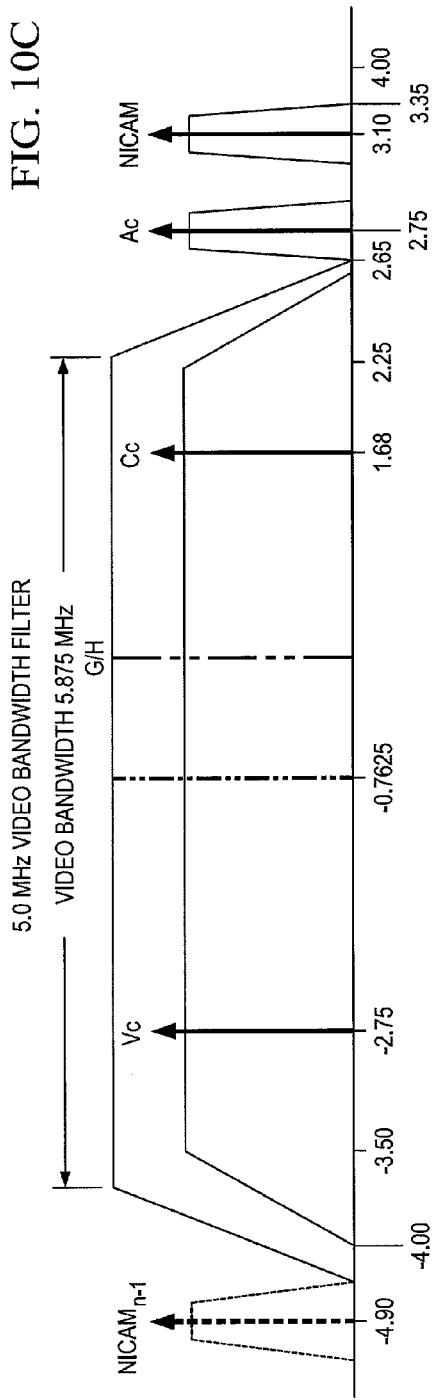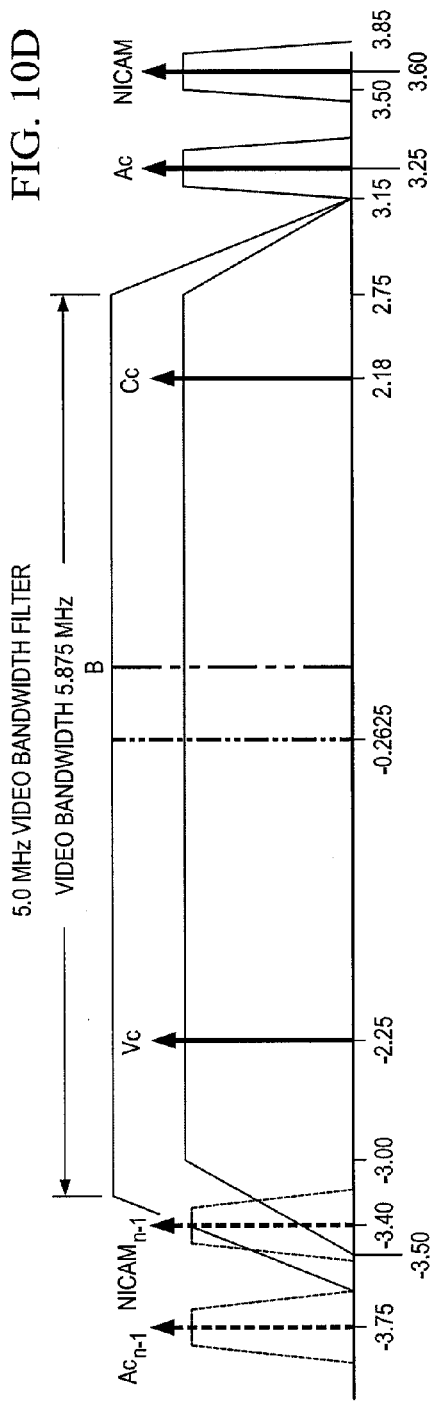

SYSTEMS AND METHODS PROVIDING MULTI-PATH LOW NOISE AMPLIFIERS WITH SEAMLESS SWITCHING

CROSS-REFERENCE TO RELATED APPLICATIONS

The present application is related to concurrently filed and commonly assigned U.S. patent application Ser. No. 12/632,624 entitled "Systems and Methods Providing In-Phase and Quadrature Equalization," application Ser. No. 12/632,571 entitled Systems and Methods Providing Spur Avoidance in a Direct Conversion Tuner Architecture," and application Ser. No. 12/632,634 entitled "Multimode Filter Architecture," the disclosures of which are hereby incorporated herein by reference.

TECHNICAL FIELD

The disclosure relates generally to signal processing and, more particularly, to providing multi-path low noise amplifiers with seamless switching for signal processing.

BACKGROUND OF THE INVENTION

Television broadcast signals, both terrestrial and cable system transmission, have been provided in accordance with various standards. For example, the National Television System Committee (NTSC), phase alternating line (PAL), and sequential color with memory (SECAM) analog broadcast color standards have been utilized in different regions of the world for a number of years. Various broadcast systems (e.g., systems B, D, G, H, I, K, L, M, and N), defining channel layout and modulation techniques, have been used throughout the world. The use of these varied broadcast standards has presented challenges for the makers of transmission and receiver equipment. For example, different tuner and filter configurations have been traditionally required for use with a particular broadcast standard, such as in set-top boxes, television sets, etc.

The recent deployment of digital television, such as using the Advanced Television Systems Committee (ATSC), digital video broadcasting-terrestrial (DVB-T), International Telecommunication Union (ITU) j.83, integrated services digital broadcasting-terrestrial (ISDB-T), and digital terrestrial multimedia broadcast (DTMB) digital broadcast standards, has added to the foregoing challenges. In particular, it is a challenge for manufacturers to support both an existing analog broadcast standard as well as a digital broadcast standard, much less support all such broadcast standards.

A typical television implementation for receiving signals of both an analog and digital broadcast standard is shown in FIG. 1 as receiver 100. Receiver 100 includes multi-conversion tuner 110, such as generally would comprise a double conversion low intermediate frequency (IF) tuner configuration, providing frequency conversion of broadcast signals (whether terrestrial, cable, etc.) to a selected low IF. Multi-conversion tuner 110 is typically configured to provide a high level of image rejection, such as through the use of image reject mixers, additional filters, etc., in order to mitigate images appearing within the desired band in association with the use of the IF.

Two separate signal processing paths are included in receiver 100 to processing of analog broadcast signals and digital broadcast signals. The processing path for analog signals includes channel filter 120 (typically a surface acoustic wave (SAW) filter) which is centered at the low IF and provides a precise pass-band for allowing substantially only a single channel of the relevant analog broadcast standard to pass. Analog demodulator 130 is provided to demodulate the analog broadcast signal and provide a composite video baseband signal (CVBS) and sound IF. The processing path for digital signals includes channel filter 140 (typically a SAW filter) which is centered at the low IF and provides a precise pass-band for allowing substantially only a single channel of the relevant digital broadcast standard to pass. Digital demodulator 150 is provided to demodulate the digital broadcast signal and provide a digital video signal and sound IF. It should be appreciated that a same channel filter may not be shared between the signal processing path for analog signals and the signal processing path for digital signals due to differing design requirements, such as to deal with vestigial sidebands etc.

The foregoing configuration provides a relatively complex tuner configuration in which a series of tuners provide frequency conversion. Moreover, images associated with the use of the multi-conversion tuner configuration demand a high level of image rejection be provided with this tuner configuration. The filtering requirements of the channel filters in the foregoing configuration demand the cutoff characteristics of SAW filter implementations. Thus it can be appreciated that the receiver configuration is not well suited to a high level of integration or simplification.

In order to accommodate multiple analog broadcast standards and/or multiple digital broadcast standards, and thus provide a flexible receiver solution, the receiver configuration would require a plurality of filters 120 and/or a plurality of filters 140. For example, to accommodate multiple analog broadcast standards a separate filter 120, adapted for use with a particular one of the analog broadcast standards, would need to be provided for each such broadcast standard. Similarly, to accommodate multiple digital broadcast standards a separate filter 140, adapted for use with a particular one of the digital broadcast standards, would need to be provided for each such broadcast standard. These filters and their attendant selection circuitry provide a receiver configuration even less suited to a high level of integration that illustrated in FIG. 1.

Past efforts to create a flexible receiver solution have resulted in unsatisfying architectures which sacrifice performance for lower cost and reduced power consumption. Performance issues such as dynamic range and channel cross modulation are symptoms of low power operation combined with inadequate architecture. Moreover, such solutions have required large blocks of software code to be uploaded to the tuner before operation with a given broadcast standard, thus providing undesirable deployment and initialization issues.

BRIEF SUMMARY OF THE INVENTION

The present invention is directed to systems and methods which provide a multimode tuner architecture implementing direct frequency conversion. Accordingly, a tuner architecture of embodiments of the invention provides a direct conversion tuner for providing frequency conversion of analog broadcast signals and digital broadcast signals for both terrestrial (off air) and cable operation. Embodiments provide a highly integrated configuration wherein low noise amplifier, tuner, analog and digital channel filter, and analog demodulator functionality are provided in a single integrated circuit (i.e., disposed upon a same integrated circuit substrate). Digital baseband processing circuitry of embodiments provides the aforementioned analog and digital channel filter and analog demodulator functionality.

A tuner architecture of embodiments of the invention provides a flexible solution adapted for use with respect to a plurality of analog and digital broadcast standards. For example, embodiments of the present invention provide a tuner architecture operable with respect to NTSC, PAL, and SECAM analog broadcast signals and ATSC, ITU j.83, DVB-T, ISDB-T, and DTMB digital broadcast signals.

Embodiments of the invention are adapted to operate with very low noise figures while accommodating a broad input frequency band (e.g., 50 MHz to 1 GHz cable television band) and signals of multiple modes provided at different signal levels, such as through the use of a low noise amplifier (LNA) operable to provide desired low noise and linearity throughout a gain range. For example, a LNA utilized near an input of a multimode direct conversion tuner architecture of an embodiment of the invention implements a multi-path configuration with seamless switching to provide desired gain control while meeting noise and linearity design parameters.

Tuner architectures of embodiments of the invention utilize circuitry adapted to facilitate the use of direct frequency conversion. For example, embodiments of the invention implement in-phase and quadrature (IQ) equalization and a multimode channelization filter architecture.

IQ equalization of embodiments of the invention mitigates direct current (DC) offset resulting from the use of a direct conversion tuner architecture, group delay introduced by the signal paths, amplitude imbalances between the I and Q signals, and/or phase imbalance between the I and Q signals. For example, IQ equalization of embodiments operates to provide DC offset compensation to avoid a self-generated spur disposed in the desired channel as a result of direct frequency conversion. Additionally or alternatively, IQ equalization of embodiments operates to provide phase and amplitude balance with respect to I and Q signal components, such as through blind equalization, calibration, and selective frequency domain detection of imbalances. Embodiments implement IQ equalization with respect to analog demodulation functionality of a multimode tuner architecture. Likewise, embodiments implement IQ equalization with respect to digital IF functionality of a multimode tuner architecture.

Multimode channelization filter architectures of embodiments of the invention provides a filter configuration adapted to accommodate both analog broadcast signal processing and digital broadcast signal processing. Moreover, embodiments of a channelization filter architecture herein accommodate a plurality of analog and digital broadcast standards. A multimode channelization filter architecture of an embodiment comprises a channel filter adapted to provide multimode signal processing operation and a vestigial filter provided for use with respect to signals after carrier and phase recovery.

Embodiments of the present invention additionally or alternatively implement spur avoidance techniques for improving tuner system operation and output. For example, embodiments implement a clock signal generation architecture in which a system clock, sampling clock frequencies, local oscillator (LO) reference clock frequencies, and/or the like are dynamically movable, providing adjustment of clocking signals for avoiding spurs in a desired channel. For example, a frequency agile system clock signal and a corresponding frequency agile sampling clock signal may be selectively generated to provide conversion of an analog signal to a digital signal and to provide digital signal processing of the converted signal while avoiding undesired spurs in a channel of interest. Additionally or alternatively, a LO reference clock signal may be utilized by a tuner circuit LO to provide frequency conversion of a signal while avoiding undesired spurs in a channel of interest. Embodiments operate to generate two or more generated clock signals using a cascaded circuit arrangement to optimize the use of clock signal generation circuitry, to provide one or more clock signals as a function of a particular generated clock signal, etc.

The use of a direct conversion tuner architecture according to embodiments provides improved image rejection due to the image falling in the desired channel being the desired channel reversed in frequency. Multimode channel filter configurations reduce the number of components required for a flexible tuner architecture, which when combined with improved image rejection provided by a direct conversion tuner architecture facilitates a high level of integration with respect to a multimode tuner configuration of embodiments herein. Accordingly, multimode tuner architectures of embodiments herein are readily adapted for implementation in a highly integrated circuit configuration. For example, embodiments may provide a direct conversion tuner and digital baseband processing integrated circuit, wherein the aforementioned digital baseband processing block provides IQ equalization, multimode channelization filtering, and spur avoidance functionality. Moreover, the digital baseband processing block of embodiments may comprise analog demodulation functionality. Accordingly, embodiments may provide a multimode direct conversion tuner integrated circuit accepting analog and digital broadcast signals (whether terrestrial, cable, etc.) and outputting CVBS and sound IF for analog broadcast signals and digital IF for digital broadcast signals.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWING

For a more complete understanding of the present invention, reference is now made to the following descriptions taken in conjunction with the accompanying drawing, in which:

FIGS. 10A-10G show configurations of the audio video separation filters of FIGS. 9A and 9B adapted for use with respect to signals of different analog standards.

DETAILED DESCRIPTION OF THE INVENTION

Figure 1:
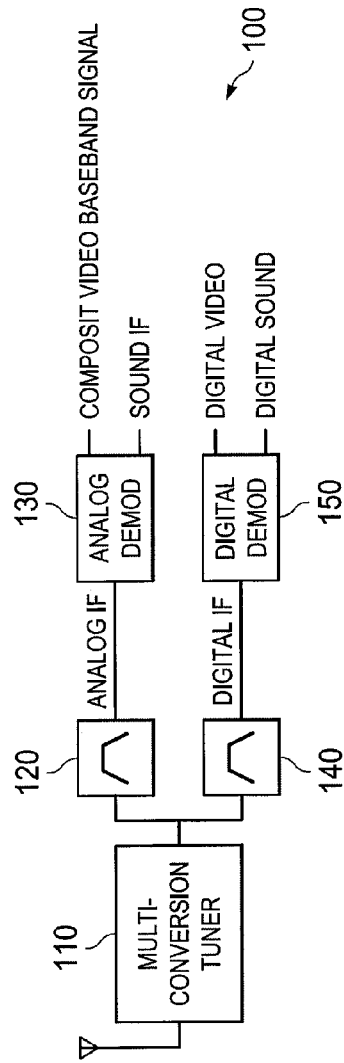
FIG. 1 shows a prior art television implementation for receiving signals of both an analog and digital broadcast standard.
Figure 2:
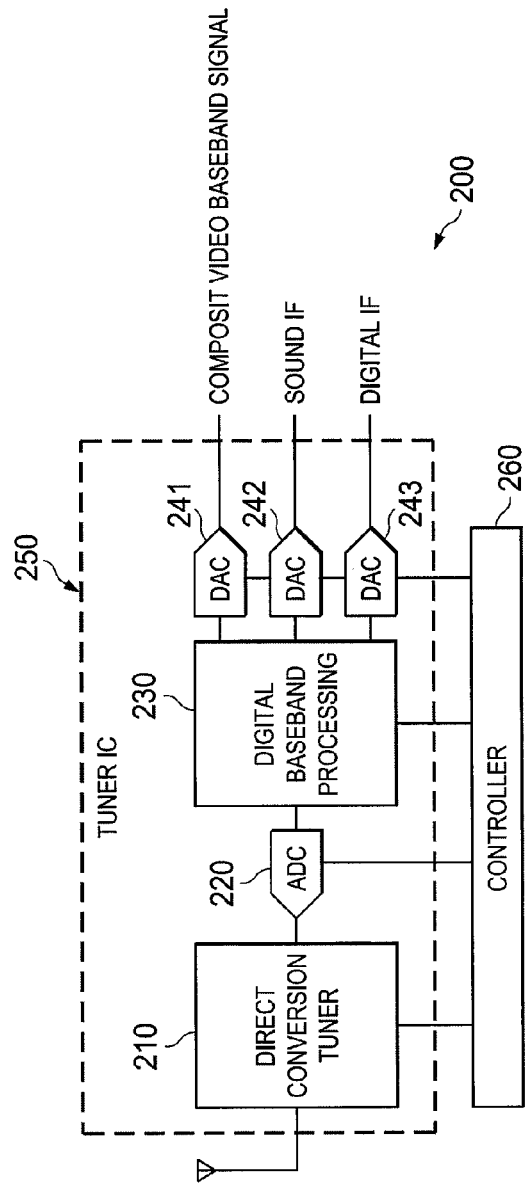
FIG. 2 shows a high level block diagram of a multimode direct conversion tuner architecture according to an embodiment of the invention.

FIG. 2 shows a high level block diagram of a multimode direct conversion tuner architecture according to an embodiment of the invention. Multimode direct conversion tuner architecture 200 of the illustrated embodiment comprises direct conversion tuner 210, analog to digital converter (ADC) 221, digital baseband processing 230, and digital to analog converters (DACs) 241-243. Further, multimode direct conversion tuner architecture 200 of the illustrated embodiment includes controller 250 to control operation of direct conversion tuner 210, analog to digital converter (ADC) 221, digital baseband processing 230, and/or digital to analog converters (DACs) 241-243 as described herein. Controller 260 may comprise memory, input and output interfaces, a general-purpose processing unit (e.g., commercially available central processing unit (CPU)), operable under control of an instruction set (e.g., software, firmware, etc.), configured to provide and/or receive appropriate control signals, data, etc. to/from one or more circuits multimode direct conversion tuner architecture 200. Additionally or alternatively, controller 260 may comprise special purpose circuitry (e.g., application specific integrated circuit (ASIC), field programmable gate array (FPGA), etc.) configured to provide and/or receive appropriate control signals, data, etc. to/from one or more circuits of multimode direct conversion tuner architecture 200.

One or more of the functional blocks or components of multimode direct conversion tuner architecture 200 may be implemented as an integrated circuit disposed upon a common integrated circuit substrate. For example, direct conversion tuner 210, analog to digital converter (ADC) 221, digital baseband processing 230, and digital to analog converters (DACs) 241-243 may all be implemented as a single integrated circuit, such as integrated circuit 250 shown in FIG. 2.

Direct conversion tuner 210 of embodiments provides direct frequency conversion of both analog broadcast signals and digital broadcast signals to one or more selected baseband frequencies. Thus, tuner 210 is adapted for multimode operation. Moreover, embodiments of tuner 210 are adapted for use with respect to a plurality of analog and digital broadcast standards. For example, embodiments of tuner 210 are operable with respect to NTSC, PAL, and SECAM analog broadcast signals and ATSC, DVB-T, ISDB-T, and DTMB digital broadcast signals. Broadcast or other signals provided to tuner 210 for frequency conversion may be terrestrial, cable, etc., and thus may be coupled to an antenna system, cable transmission system, etc.

Digital baseband processing 230 of embodiments provides baseband processing of analog and digital broadcast signals. As shown in further detail below, digital baseband processing 230 implements IQ and group delay equalization to facilitate the use of direct conversion tuner 210. Additionally or alternatively, digital baseband processing 230 of embodiments implements a multimode channelization filter architecture, such as through a digital channel filter and digital vestigial filter configuration. According to embodiments, digital baseband processing 230 comprises an analog demodulator operable in cooperation with a channelization filter architecture of digital baseband processing 230 to provide output of CVBS and sound IF signals with respect to analog broadcast signals. Digital baseband processing 230 provides channelization of digital broadcast signals to provide output of digital IF signals, such as for further processing by a digital demodulator, according to embodiments of the invention.

ADC 221 of the illustrated embodiment provides conversion of baseband signals as provided by direct conversion tuner 210 to digital signals for processing by digital baseband processing 230. Correspondingly, DACs 241-243 of the illustrated embodiments provide conversion of digital signals provided by digital baseband processing 230 to baseband signals (e.g., CBVS and sound IF for analog broadcast signals and digital IF for digital broadcast signals) for interfacing with downstream circuitry. Accordingly, multimode direct conversion tuner architecture 200 of embodiments may provide direct replacement of conventional tuner circuitry and interface with conventional configurations of downstream circuitry (e.g., video displays, digital demodulators, etc.).

Figure 3A:
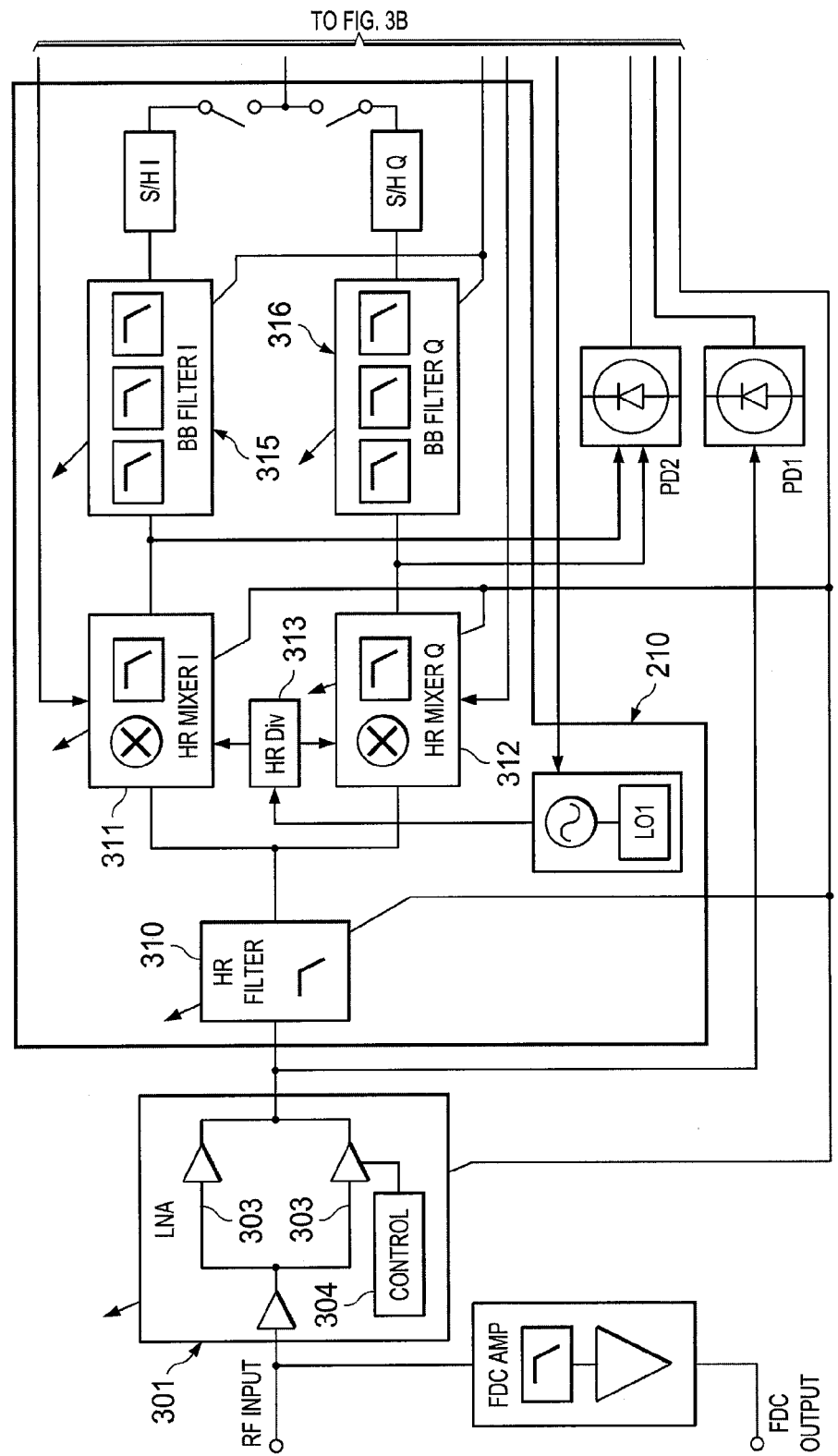
FIGS. 3A and 3B show additional detail with respect to an embodiment of the multimode direct conversion tuner architecture shown in FIG. 2.
Figure 3B:
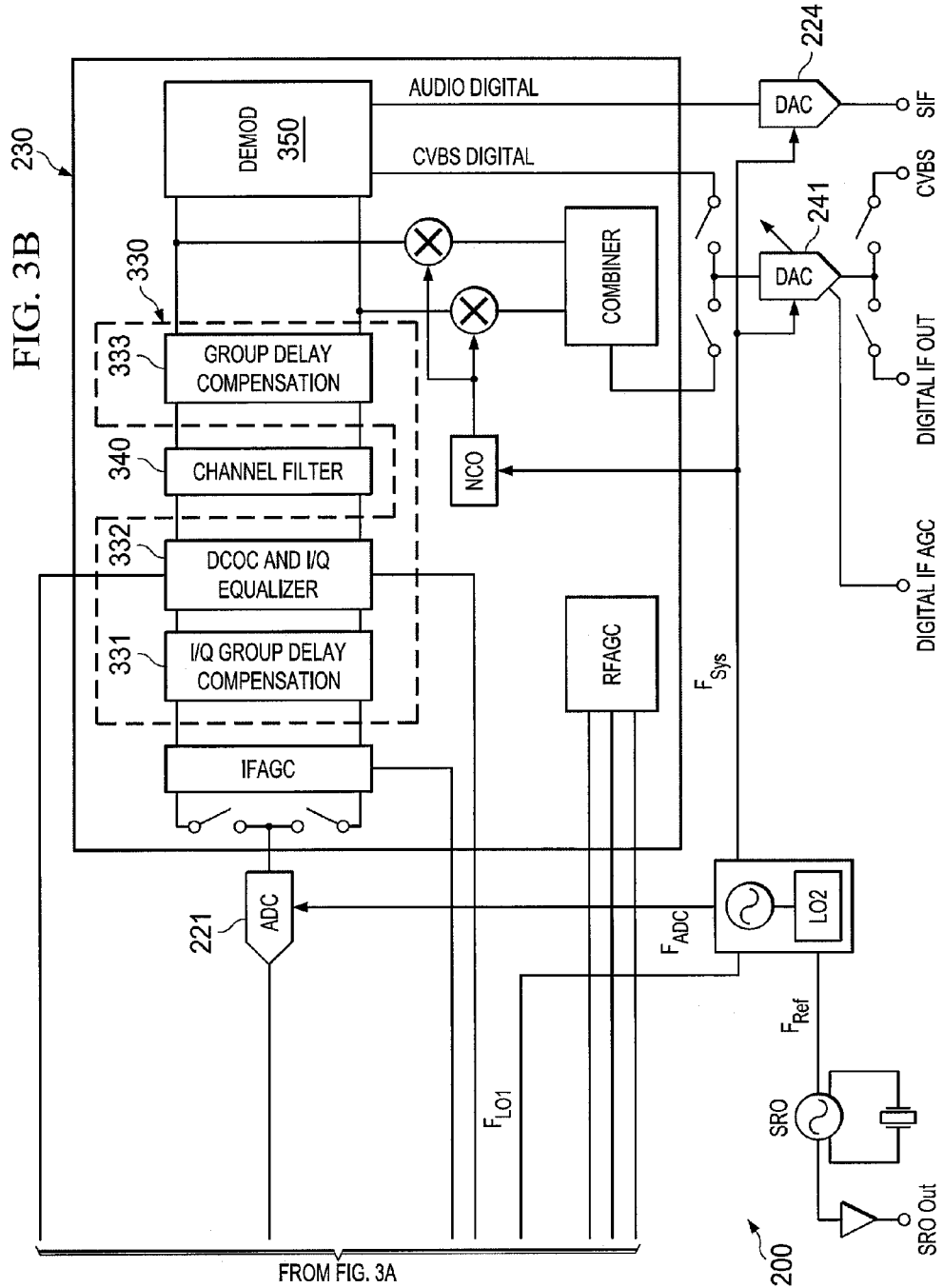

Directing attention to FIGS. 3A and 3B, additional detail with respect to multimode direct conversion tuner architecture 200 of embodiments is shown. In particular, additional detail with respect to functional blocks of direct conversion tuner 210 and digital baseband processing 230 are shown.

The embodiment of direct conversion tuner 210 illustrated in FIGS. 3A and 3B comprises a harmonic-rejection mixer configuration. Specifically, the illustrated embodiment of direct conversion tuner 210 comprise harmonic rejection filter 310, in-phase (I) mixer 311, and quadrature (Q) mixer 312. The mixers are provided a multiple phase local oscillator signal from LO1 314 by harmonic-reject phase sifter 313. The LO multiple clock phases are combined with three varying gain paths within each I and Q mixer to attenuate the third and fifth order mixing products from the LO signal, as well as split the input signal into I and Q components. Harmonic reject filter 310 attenuates the seventh and higher harmonics as well as helps in the attenuation of the third and fifth harmonics. I baseband filter 315 and Q baseband filter 316 provide filtering of channels adjacent to the desired channel which has been converted to baseband.

A harmonic-rejection mixer configuration is utilized according to embodiments of the invention to eliminate or mitigate additional filter requirements. Additionally, the harmonic-rejection mixer configuration facilitates integration of the multimode direct conversion tuner architecture using a low component count while achieving low phase noise.

Multimode direct conversion tuner architecture 200 of the embodiment illustrated in FIGS. 3A and 3B provides an efficient implementation in which resources, such as LNA 301, harmonic reject mixers 315 and 316, IQ equalization 330, multimode channelization filter architecture 340, and DAC 241, provide multimode operation. For example, DAC 241 provides a shared DAC for analog CVBS signal output and digital IF output. Additional detail with respect to multimode operation of various resources of embodiments of a multimode direct conversion tuner architecture are provided below.

Embodiments of multimode direct conversion tuner architecture 200 are adapted to accommodate a broad input frequency band (e.g., 50 MHz to 1 GHz cable television band) and signals of multiple modes provided at various different signal levels. LNA 301 of the embodiment illustrated in FIGS. 3A and 3B is operable to provide desired low noise and high linearity throughout an automatic gain control (AGC) range for processing the foregoing multimode signals. Specifically, LNA 301 of the illustrated embodiment implements a multi-path configuration, providing high linearity path 302 and low noise path 303. LNA 301 of embodiments operates to cooperatively utilize high linearity path 302 and low noise path 303 to provide a desired gain level meeting desired noise and linearity parameters, wherein the cooperative gain provided by these paths is seamlessly controllable.

High linearity typically comes at the cost of noise performance and, conversely, low noise operation typically comes at the cost of linearity. Thus, providing signal gain with both low noise and high linearity is difficult to achieve, particularly in LNA implementations. However, LNA 301 of embodiments provides gain control as a result of the cooperative operation of high linearity path 302 and low noise path 303. High linearity path 302 of embodiments includes a variable gain amplifier configuration (e.g., comprising a variable gain operational amplifier and filter implementation) adapted to provide highly linear operation throughout the frequency band input to multimode direct conversion tuner architecture 200. Correspondingly, low noise path 303 of embodiments includes a variable gain amplifier configuration (e.g., comprising a variable gain operational amplifier configuration without filtering) adapted to provide low noise operation throughout the frequency band input to multimode direct conversion tuner architecture 200.

The variable gain operation of LNA 301 of embodiments is provided through the aforementioned variable gain amplifiers of high linearity path 302 and low noise path 303. For example, in a highest gain operation of LNA 301 of an embodiment of the invention the gain of variable gain amplifiers in both high linearity path 302 and low noise path 303 are adjusted to selected "highest" gain settings (it being appreciated that each amplifier's "highest" gain setting may not be the same or reached at the same point in AGC operation). As the gain of LNA 301 is to be lowered, the gain of the variable gain amplifiers of high linearity path 302 and low noise path 303 are lowered. In a lowest gain operation of LNA 301 of an embodiment of the invention the gain of variable gain amplifiers in both high linearity path 302 and low noise path 303 are adjusted to selected "lowest" gain settings (it being appreciated that each amplifier's "lowest" gain setting may not be the same or reached at the same point in AGC operation).

In operation according to embodiments of the invention, LNA 301 adjusts the contributions of high linearity path 302 and low noise path 303 to provide an output of LNA 301 having a desired gain level while meeting noise and linearity parameters. For example, LNA 301 of embodiments provides inverse control with respect to high linearity path 302 and low noise path 303 in AGC operation. With such operation, when low noise path 303 is fully on (e.g., greatest contribution from this path) and high linearity path 302 is fully off (e.g., least contribution from this path), LNA 301 provides excellent noise performance and poorer linearity. When low noise path 303 is fully off (e.g., least contribution from this path) and high linearity path 302 is fully on (e.g., greatest contribution from this path), LNA 301 provides excellent linearity and poorer noise performance. Control of low noise path 303 and high linearity path 302 between these extremes provides a spectrum of linearity and noise performance for selection as desired.

It should be appreciated that when less gain is desired (e.g., a signal of relatively high signal strength is being received), higher linearity is typically desirable and, conversely, when more gain is desired (e.g., a signal of relatively low signal strength is being received), high noise performance is typically desirable. Accordingly, embodiments of the invention provide operation such that LNA 301 increases the relative contribution of high linearity path 302 as gain provided by LNA 301 is increased and increases the relative contribution of low noise path 303 as gain provided by LNA 301 is decreased. A preferred embodiment of the invention provides an implementation of LNA 301 in which high linearity path 302 is fully off and low noise path 303 is fully on at a lowest gain setting provided by LNA 301 and in which high linearity path 302 and low noise path 303 equally contribute to the signal processing at a highest gain setting provided by LNA 301. Such a configuration provides acceptable linearity and noise performance throughout the operation of LNA 301. Of course, LNA 301 may be controlled to operate differently, as appropriate or desired.

Switching between operation of high linearity path 302 and low noise path 303 could result in undesired signal perturbations or otherwise result in undesired signal attributes. Accordingly, embodiments of the invention are adapted to provide seamless switching or control between the contributions of high linearity path 302 and low noise path 303 to the output of LNA 301.

To facilitate the aforementioned seamless switching, embodiments of LNA 301 provide seamless control of the contribution of high linearity path 302 and low noise path 303 through the bias currents of the amplifiers thereof. Increasing the bias current of a particular path is utilized to increase the contribution of that path to the operation of LNA 301 and, correspondingly, decreasing the bias current of a particular path is utilized to decrease the contribution of that path to the operation of LNA 301. To provide the aforementioned inverse contribution relationship, the output of amplifiers of high linearity path 302 and low noise path 303 are coupled to a same load resistor, wherein the voltage drop across the load resistor provides control such that a change in bias current to one such amplifier causes a corresponding, but inverse change in bias current in the other such amplifier. Accordingly, the bias current of one such amplifier may be controlled to provide selective contributions from high linearity path 302 and low noise path 303 throughout the range of high linearity path 302 being fully off and low noise path 303 being fully on, high linearity path 302 being fully on and low noise path 303 being fully off, and the spectrum of relative contributions therebetween.

In providing AGC operation which avoids undesired signal attributes resulting from controlling the gain of different amplifiers of LNA 301, a configuration of LNA 301 fixes the gain provided by an amplifier of high linearity path 302 (e.g., fixes the gain at a selected "highest" gain setting) throughout the gain control range of low noise path 303. In such a configuration, the gain of the amplifier of high linearity path 302 may then be adjusted (e.g., decreased) once the gain control range of low noise path 303 reaches an end point (e.g., a selected "lowest" gain setting) where further gain control is desired of LNA 301. The foregoing configuration provides for seamless gain control throughout an AGC range of LNA 301, wherein the contribution of low noise path 303 is dominate at a highest gain setting of LNA 301 and the contribution of high linearity path 302 is dominate at a lowest gain setting of LNA 301.

Embodiments of LNA 301 are configured to provide the aforementioned seamless switching and AGC operation in response to a single control input. For example, control circuitry of LNA 301 (e.g., control circuitry 304) may be configured to respond to a single control input and provide the aforementioned bias control and gain control with respect to amplifiers of high linearity path 302 and low noise path 303. For example, an AGC control signal may be provided to LNA 301 to decrease the gain provided by LNA 301, whereby control circuits of LNA 301 operate to decrease the gain and bias current of an amplifier of low noise path 303 while increasing the bias current of an amplifier of high linearity path 302. Where the AGC control signal provided to LNA 301 commands the gain provided by LNA 301 to be below a value to which low noise path 303 is to contribute, control circuits of LNA 301 may operate to provide a lowest gain and bias current setting with respect to an amplifier of low noise path 303 while appropriately controlling the bias current and gain of an amplifier of high linearity path 302 to provide the desired gain.

It should be appreciated that the switching associated with digital clocks providing clock signals, such as a reference clock signal utilized by LO1 314 to provide a desired local oscillator frequency and/or system clock utilized by digital baseband processing 230, may introduce noise into the circuit at the frequency of the clock signal switching and harmonics thereof. This noise may propagate through the circuitry (e.g., through substrated coupling, power supply, etc.), particularly in highly integrated circuitry, and thus be present at various component inputs and thus be intermingled with the signals being processed. For example, digital clock switching noise may appear at the input to low noise amplifier (LNA) circuit 301, which is particularly sensitive to even relatively low levels of noise due to the typically low signal levels of the desired signals present at this input. Such noise may result in spurs falling within a desired signal thus degrading the operation of the circuitry.

Embodiments of the invention implement spur avoidance techniques wherein the system clock frequency and sampling clock frequencies are dynamically movable. Accordingly, these frequencies may be adjusted to avoid spurs falling within a desired signal bandwidth (e.g., avoid spurs falling within a 6 MHz or 8 MHz bandwidth of a selected television signal channel). Additionally or alternatively, embodiments of the spur avoidance techniques provide a dynamically movable reference clock frequency for use with the local oscillator of the direct conversion tuner, thereby allowing selection of the local oscillator reference clock frequency to avoid spurs falling within a desired signal bandwidth.

The embodiment of the spur avoidance dynamic clock frequency architecture shown in FIGS. 3A and 3B utilizes LO2 302 to generate a plurality of frequency agile clock signal outputs to provide control and coordination of frequency agile clock frequencies for spur avoidance. Specifically, LO2 302 of the illustrated embodiment utilizes a reference clock signal, $F_{Ref}$, provided by reference oscillator 303 to generate clock signal outputs $F_{Sys}$, $F_{ADC}$, and $F_{LO1}$ which are selectable to avoid the clock signals and/or relevant harmonics (i.e., harmonics having amplitudes and/or other attributes sufficient to degrade desired performance) thereof from falling with a desired signal bandwidth. Moreover, as will be better understood from the discussion which follows, frequency selection of at least some of the frequency agile clock signals is coordinated to facilitate desired operation.

LO1 314 utilizes the frequency agile local oscillator reference clock signal $F_{LO1}$ output by LO2 302 as its reference clock signal, thereby providing frequency agile operation of LO1 314 for spur avoidance. The frequency of the local oscillator reference clock signal $F_{LO1}$ can be selected so as to avoid spurs associated therewith falling within a desired signal bandwidth. For example, where 6 MHz bandwidth television channel signals are being processed, the frequency of the local oscillator reference clock signal $F_{LO1}$ may be selected so that the reference frequency and/or its relevant harmonics falls outside of the 6 MHz or 8 MHz band centered at the desired television channel signal. Accordingly, the LO utilized with respect to the direct conversion tuner of a multimode direct conversion tuner architecture herein may be implemented as an on-chip LO, as opposed to directly using a crystal reference, thereby facilitating a high degree of integration while providing a desired level of system performance.

The illustrated architecture utilizes a fixed reference clock signal ($F_{Ref}$) provided by reference oscillator 303 for LO2 302 and a dynamically adjustable local oscillator reference clock signal ($F_{LO1}$) provided by LO2 302 for LO1 314. Although the fixed reference clock signal $F_{Ref}$ is not dynamically adjustable, and thus it or its harmonics may be within a desired signal bandwidth, embodiments physically dispose LO2 302 sufficiently distant from circuitry (e.g., LNA 301) which may be adversely affected by spurs associated with this reference clock signal ($F_{Ref}$) and/or implement more traditional circuit isolation techniques (e.g., filtering, decoupling, etc.) to mitigate the effects of associated spurs. In contrast, LO1 314 will typically be physically disposed very near the tuner architecture mixer circuitry to avoid phase errors etc., and thus is physically disposed more near circuitry (e.g., LNA 301) which may be adversely affected by spurs associated with its local oscillator reference clock signal ($F_{LO1}$) according to embodiments. Accordingly, providing a frequency agile reference clock signal with respect to LO1 314, although not with respect to LO2 302, provides an optimized architecture for spur avoidance.

System clocks utilized by digital processing circuits are often a source of spurious signals due to the close proximity of the switching associated with the system clock signals to the processing of the desired signal, due to the number of circuit elements being switched by the system clock, etc. Accordingly, the system clock utilized by digital baseband processing 230, if not adapted in accordance with the concepts herein, may result in degraded performance of the multimode direct conversion tuner due to spurs associated with the system clock.

The illustrated embodiment of LO2 302 provides a frequency agile system clock signal ($F_{Sys}$) which can be selected so as to avoid spurs falling within a desired signal bandwidth. For example, where 6 MHz bandwidth television channel signals are being processed, the frequency of $F_{Sys}$ may be selected so that the system clock frequency and/or its relevant harmonics fall outside of the 6 MHz or 8 MHz band centered at the desired television channel signal.

The system clock frequency of digital baseband processing 230 and the sampling rate of ADC 221 are preferably related to facilitate proper processing of digital signals provided by ADC 221. According to embodiments of the invention, the system clock frequency is an integer product of the ADC sampling rate. For example, the system clock frequency may be 4 times the ADC sampling rate. Accordingly, embodiments of LO2 302 operate to coordinate the ADC sampling rate with the dynamically adjustable system clock by relating the frequency of the frequency agile system clock signal and the frequency of the frequency agile ADC sampling rate clock.

Figure 4:
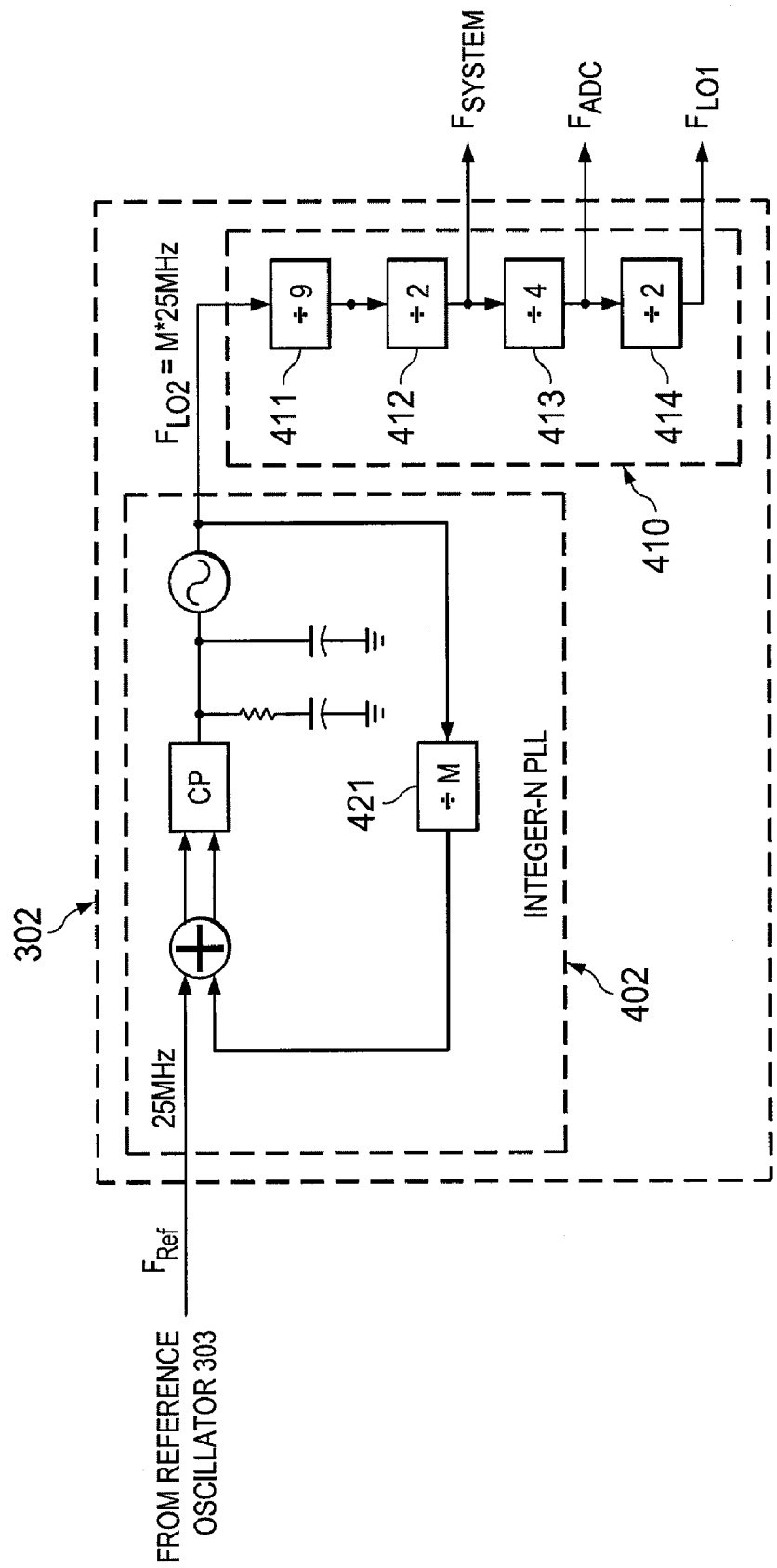
FIG. 4 an embodiment of a local oscillator circuit adapted to provide a plurality of frequency agile clock signal outputs according to an embodiment of the invention.

Directing attention to FIG. 4, an embodiment of LO2 302 adapted to provide the aforementioned plurality of frequency agile clock signal outputs for spur avoidance. The embodiment of FIG. 4 is further adapted to provide control and coordination of frequency agile clock frequencies.

LO2 302 of the illustrated embodiment includes integer-N phase locked loop (PLL) LO 402 operable to provide output of frequency agile local oscillator signal $F_{LO2}$. The frequency of local oscillator signal $F_{LO2}$ is selectable through selection of a value of the PLL feedback divide-by integer (M). Specifically, the frequency of local oscillator signal $F_{LO2}$ of the illustrated embodiment is the product of the frequency of the reference clock frequency and the PLL feedback divide-by integer (M). Accordingly, the value of the PLL feedback divide-by integer (M) may be selected by controller 260 (FIG. 2) and provided to divide-by circuit 421 to dynamically control the frequency of local oscillator signal $F_{LO2}$. For example, where reference oscillator 307 provides a reference clock signal, $F_{Ref}$, oscillating at 25 MHz and M is selected by controller 260 to be 150, the frequency of local oscillator signal $F_{LO2}$ of the illustrated embodiment would be dynamically controlled to be 3750 MHz.

LO2 302 of the illustrated embodiment further includes clock signal generation block 410 operable to provide output of the plurality of frequency agile clock signals. Specifically, clock signal generation block 410 utilizes local oscillator signal $F_{LO2}$ to generate clock signal outputs $F_{Sys}$, $F_{ADC}$, and $F_{LO1}$. In the illustrated embodiment, the clock signals generated by clock signal generation block 410 are selected as a function of selection of the PLL feedback divide-by integer (M). Specifically, clock signal generation block 410 comprises divide-by circuits 411-414 utilized to provide output of clock signals as different quotients resulting from the frequency of local oscillator signal $F_{LO2}$ having been divided by a divisor associated with one or more of divide-by circuits 411-414. The divisor values associated with divide-by circuits 411-414 may be selected to provide acceptable clock signal frequencies for a particular frequency range of local oscillator signal $F_{LO2}$ (e.g., expected or operating frequency range).

As discussed above, the frequency agile system clock signal and the frequency of the frequency agile ADC sampling rate clock are coordinated by embodiments of LO2 302. Accordingly, the illustrated embodiment of clock signal generation block 410 provides a cascaded clock signal generation circuit in which the generated system clock signal $F_{Sys}$ is utilized to generate the ADC sampling rate clock signal $F_{ADC}$. These two clock signals are coupled in clock signal generation block 410 by divide-by circuit 413. Thus the frequencies of the system clock signal $F_{Sys}$ and the ADC sampling rate clock signal $F_{ADC}$ are related, irrespective of the particular local oscillator signal frequency used, and differ by the divisor associated with divide-by circuit 413.

As can be seen in FIG. 4, the illustrated embodiment of clock signal generation block 410 provides a cascaded clock signal generation circuit in which the generated ADC sampling rate clock signal $F_{ADC}$ is utilized to generate the local oscillator reference clock signal $F_{LO1}$. Thus, the frequency of local oscillator reference clock signal $F_{LO1}$ of the illustrated embodiment is coordinated with both the frequency of system clock signal $F_{Sys}$ and the frequency of ADC sampling rate clock signal $F_{ADC}$. It should be appreciated that, although the local oscillator reference clock signal $F_{LO1}$ need not be coordinated with the system clock or the ADC sampling rate, doing so allows the spur avoidance to be much simpler since harmonics of $F_{LO1}$ will fall at exactly the same frequencies as $F_{ADC}$ and $F_{Sys}$. Additionally, the frequency of this clock signal is less than that of the system clock signal $F_{Sys}$ and the ADC sampling rate clock signal $F_{ADC}$, and thus the cascaded circuit configuration provides an efficient means by which local oscillator reference clock signal $F_{LO1}$ may be generated (e.g., minimizing additional circuitry used to generate the local oscillator reference clock by leveraging circuitry used to generate other clock signals.

Exemplary values for the frequency of reference oscillator signal $F_{Ref}$ and PLL feedback divide-by integer (M) are discussed below to aid in the understanding of the operation of embodiments of LO2 302 illustrated in FIG. 4. It should be appreciated that the concepts of the present invention are not limited to the particular exemplary values given. Moreover, the invention is not limited to any particular configuration of LO2 302, provided dynamically selectable clock signals facilitating operation according to embodiments of the invention are provided. For example, although the illustrated embodiment of LO2 302 includes clock signal generation block 410 in which divide-by circuits 411-414 have divisors of 9, 2, 4, and 2 associated therewith, respectively. Different numbers of divide-by circuits, different divisors, and even different circuit configurations (e.g., parallel rather than cascaded configurations) may be utilized. Divide-by circuit configuration of embodiments of the invention may implement any divisor determined to provide a corresponding frequency agile clock signal within a desired operating range. The particular number and configuration of divide-by circuits used may be selected based upon ease of implementation (e.g., two stages providing divide-by 9 and divide-by 2 may be easier to implement than one stage providing divide-by 18), to provide flexibility (e.g., allow for an additional clock signal to be output between divide-by circuit 411 and divide-by circuit 412 if desired in a particular implementation), etc.

Continuing with the foregoing example, the frequency of reference oscillator signal $F_{Ref}$ is assumed to be 25 MHz. Thus, $F_{LO2}$=M*25 MHz. Selecting the values of 139, 146, 150, and 156 for M gives the generated frequencies for $F_{LO2}$, $F_{Sys}$, $F_{ADC}$, and $F_{LO1}$ shown in the table below. It can be seen from the table below that judicious selection of the PLL feedback divide-by integer (M) in the embodiment of LO2 302 illustrated in FIG. 4 may be utilized to avoid or minimize the clock signals and/or relevant harmonics thereof from falling with a desired signal bandwidth.

| Clock Frequencies (MHz) | | | | |
| --- | --- | --- | --- | --- |
| M | $F_{LO2}$ | $F_{Sys}$ | $F_{ADC}$ | $F_{LO1}$ |
| 139 | 3475 | 193.06 | 48.26 | 24.13 |
| 146 | 3650 | 202.78 | 50.69 | 25.35 |
| 150 | 3750 | 208.33 | 52.08 | 26.04 |
| 156 | 3900 | 216.67 | 54.17 | 27.08 |

It should be appreciated that implementing a dynamically selectable system clock frequency with respect to digital processing circuitry, such as that of digital baseband processing 230, as described in the foregoing embodiment adds to the complexity of the digital processing. For example, different parameters for implementing filters in such digital processing circuitry would typically be needed for use with each system clock frequency. Accordingly, embodiments of the invention are configured to provide a plurality of predetermined clock signal combinations (i.e., selected values of M) that provide spur avoidance for a range of signals to be processed (e.g., all or substantially all 6 MHz or 8 MHz television signal channels within the range of 50-800 MHz). A manageable set of digital signal processing parameters, such as the aforementioned digital filter parameters, for each system clock frequency of the predetermined clock signal combinations may thus be readily provided.

In development of the present invention it was determined that the values of M in the table above, as implemented in the embodiment of LO2 302 of FIG. 4 using a 25 MHz reference oscillator signal and a direct conversion tuner architecture a illustrated in FIG. 2, provide clock signal frequencies adequately avoiding spurs in all 6 MHz or 8 MHz television signal channels within the range of 50-800 MHz. That is, by selecting an appropriate value of the PLL feedback divide-by integer (M) from the above table for a particular television signal channel of interest, sufficient spur avoidance may be achieved to meet typical system performance requirements (e.g., DOCSIS requirements).

In operation, the appropriate digital processing parameters may be provided to digital baseband processing 230 by or selected by controller 260 in combination with controller 260 providing a selected PLL feedback divide-by integer (M) to LO2 302. For example, controller 260 may store or generate sets of digital processing parameters in association with a corresponding PLL feedback divide-by integer (M) for use in controlling LO2 302 and digital baseband processing 230.

It should be appreciated that switching associated with various clock signals is not the only source of spurs and other undesired signal processing artifacts. For example, DC offset resulting from the use of a direct conversion tuner architecture may result in a self-generated spur appearing within the signal of interest. Additionally, group delay distortions introduced by the signal paths, amplitude imbalances between the I and Q signals, and/or phase imbalance between the I and Q signals may result in image signal components not properly being rejected or other signal processing artifacts. Accordingly, in addition to or in the alternative to the foregoing spur avoidance techniques, embodiments of the invention implement IQ equalization techniques.

IQ equalization of embodiments operates to provide DC offset compensation to avoid a self-generated spur disposed in the desired channel as a result of direct frequency conversion. Additionally or alternatively, IQ equalization of embodiments operates to provide phase and amplitude balance with respect to I and Q signal components, such as through blind equalization, calibration, and selective frequency domain detection of imbalances.

Referring again to FIGS. 3A and 3B, IQ equalization 330 according to embodiments of the invention is shown in digital baseband processing 230. The illustrated embodiment of IQ equalization 330 comprises several functional blocks to provide desired aspects of IQ equalization. In particular, IQ group delay compensation 331, DC offset correction (DCOC), and IQ equalizer 332 and group delay compensation 333 are included to provide IQ equalization according to the illustrated embodiment. For example, as is discussed in further detail below, IQ group delay compensation 331 and group delay compensation 333 provide phase tilt correction associated with signal path group delay. DCOC and IQ equalizer 332 provides correction for DC offset in the baseband signal from direct conversion tuner 210 and provides phase and amplitude balance correction with respect to I and Q signal components and. Embodiments of the invention implement both calibration and free-running IQ equalization techniques to provide the foregoing IQ equalization.

Figure 5A:
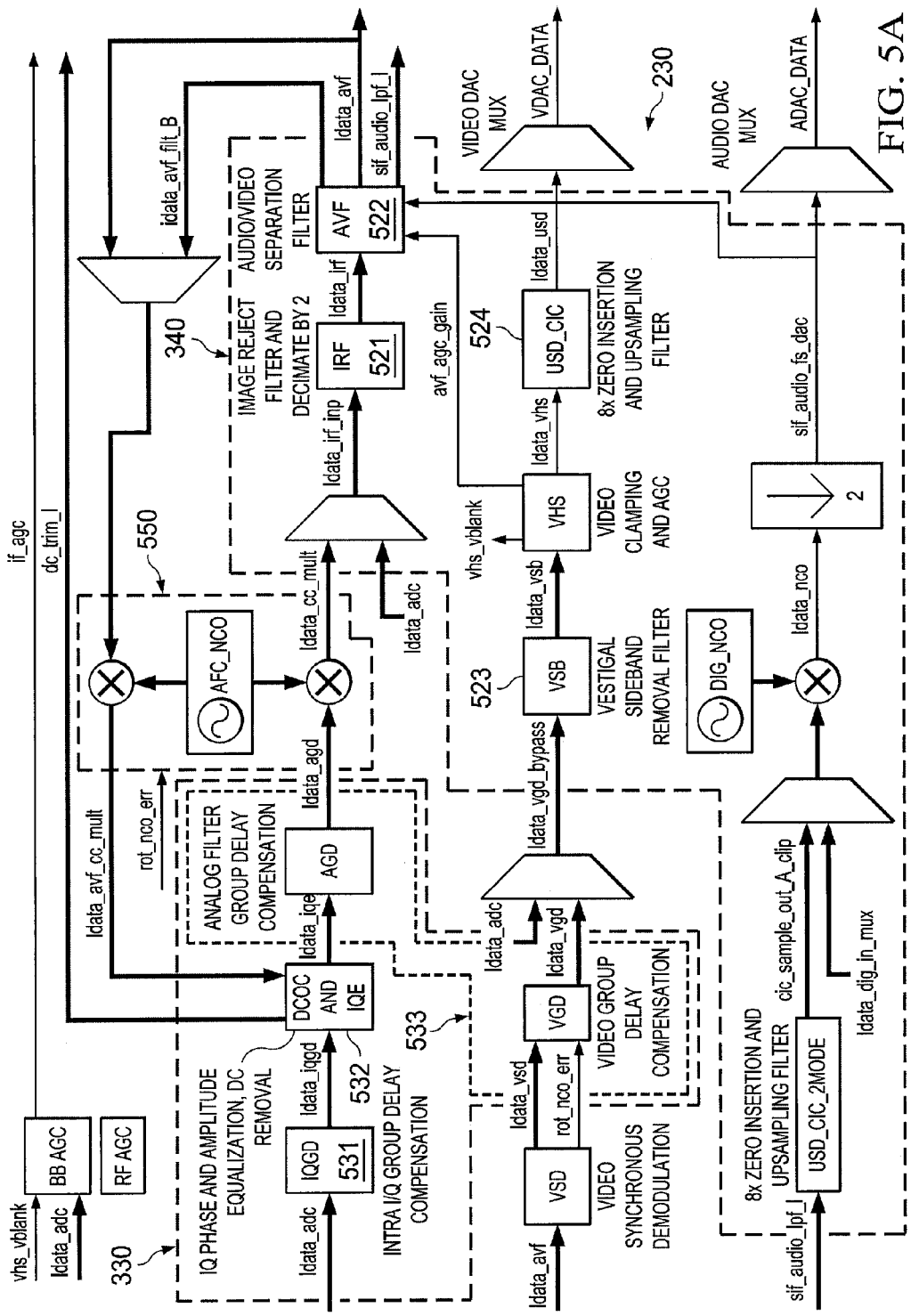
FIGS. 5A and 5B show in-phase and quadrature equalization circuit configurations of embodiments of the invention.
Figure 5B:
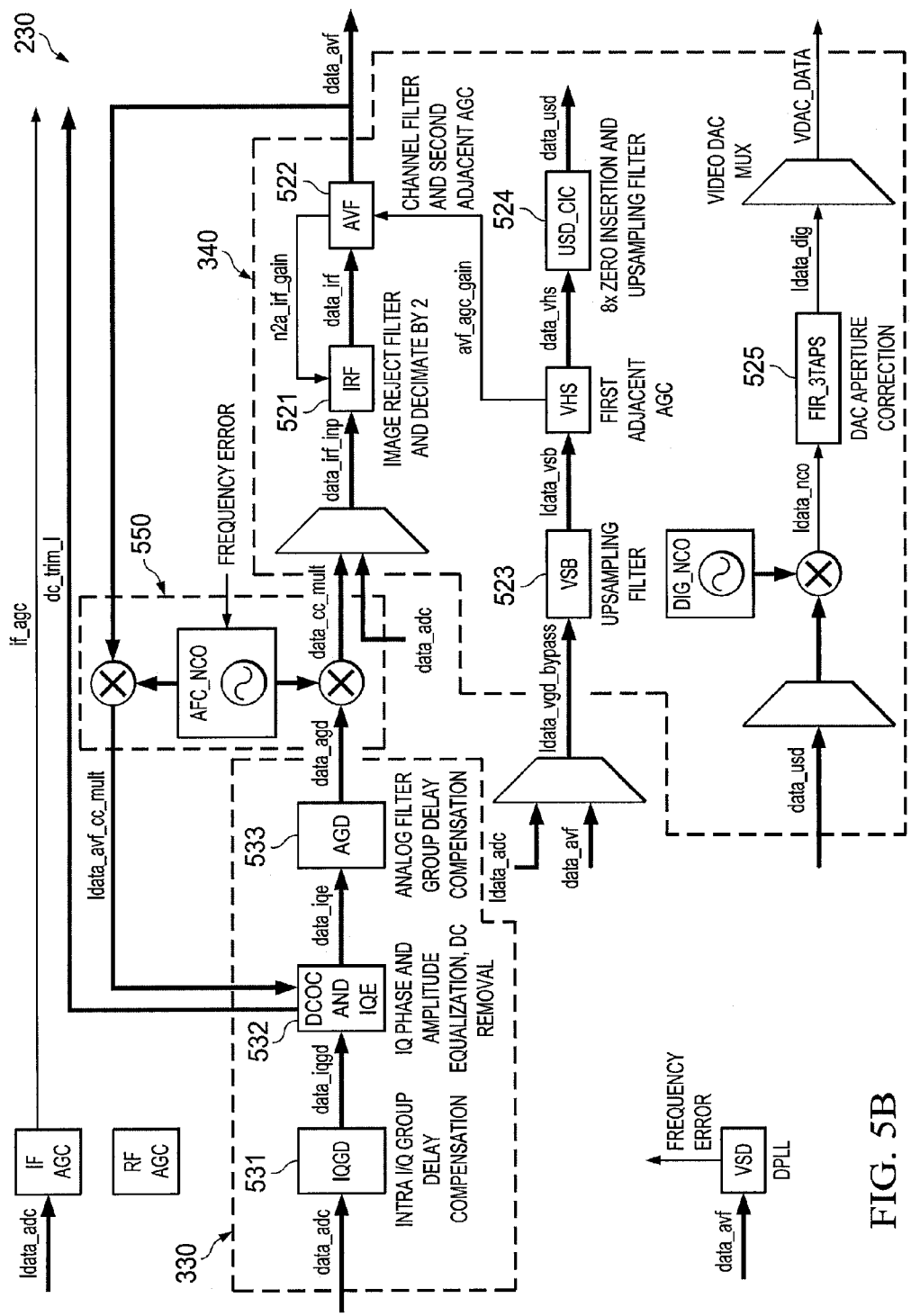

Further detail with respect to IQ equalization configurations of embodiments of the invention is shown in FIGS. 5A and 5B, wherein FIG. 5A shows a block diagram of a portion of an analog mode data path of an embodiment of digital baseband processing 230 and FIG. 5B shows a block diagram of a portion of an analog mode data path of an embodiment of digital baseband processing 230. In the embodiments of FIGS. 5A and 5B, IQ group delay compensation 331 of FIG. 3B is configured to provide intra IQ group delay compensation and is thus denoted at IQGD 531 and group delay compensation 333 is configured to provide analog filter group delay compensation and thus is denoted as AGD 533. DCOC and IQ equalizer 332 is denoted as IQE 532 in FIGS. 5A and 5B. As can be appreciated from FIGS. 5A and 5B, implementation of IQ equalization techniques according to embodiments of the invention may differ to some degree with respect to an analog mode data path and a digital mode data path.

IQ equalization 330 of the embodiments of FIGS. 5A and 5B utilizes one or more calibration operations, such as may be performed on initialization of the multimode direct conversion tuner circuit, at power up, upon deployment, etc., to correct for IQ imbalance associated with the circuit configuration, mismatch of components, etc. For example, a calibration operation may be utilized in implementing phase tilt correction of IQGD 531 of embodiments of IQ equalization 330. Additionally or alternatively, a calibration operation may be utilized in implementing analog filter group delay compensation of AGD 532 of embodiments of IQ equalization 330.

IQ equalization 330 of the embodiments of FIGS. 5A and 5B additionally or alternatively utilizes one or more free-running (run-time) operations to correct for IQ imbalance associated with circuit configuration, mismatch of components, etc. For example, a free-running operation may be utilized in implementing DC offset correction of embodiments of IQE 532. Additionally or alternatively, a free-running operation may be utilized in implementing IQ phase and amplitude correction of IQE 532.

Figure 6:
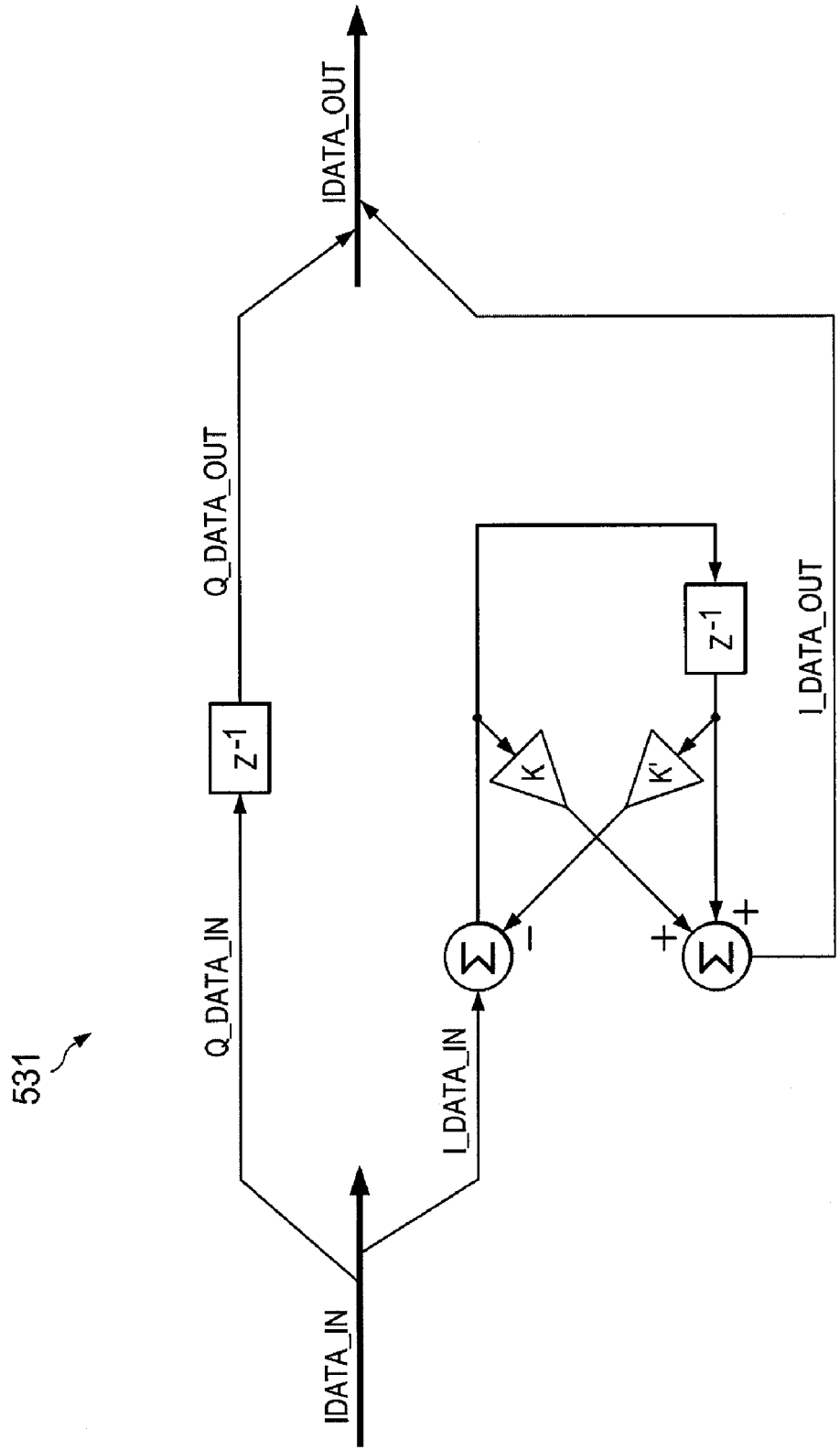
FIG. 6 shows detail with respect to an embodiment of an in-phase and quadrature group delay circuit of the in-phase and quadrature equalization circuit configurations shown in FIGS. 5A and 5B.

FIG. 6 shows detail with respect to an embodiment of IQGD 531 of IQ equalization 330 illustrated in FIGS. 5A and 5B. IQGD 531 of the illustrated embodiment performs phase tilt correction between the I and Q signal paths, such as to provide second order compensation due to mismatch between these paths in the analog domain. In operation according to embodiments, IQGD 531 is configured to delay various frequencies in a linear way in the I path versus the Q path. The desired frequency distortion to provide phase tilt correction is provided according to the embodiment illustrated in FIG. 6 using a Lattice all-pass filter. The configuration of IQGD 531 shown in FIG. 6 is capable of providing phase correction of +/−2° with 0.02 degree resolution.

A calibration process is utilized according to embodiments to initialize IQGD 531 to correct for the phase offset introduced by the I and Q signal paths. In a calibration process of a preferred embodiment a clock is generated in the digital domain which is fed into the analog portion of multimode direct conversion tuner architecture 200, e.g., direct conversion tuner 210. This digital clock signal passes through the I and Q paths of the circuitry (e.g. the data path of the mixer and the baseband filters), returning to digital baseband processing 230 wherein a phase offset of the digital clock for the paths is measured. The phase distortion introduced by the analog processing circuits can be measured according to embodiments of the invention by analyzing the I and Q signals provided to digital baseband processing 230. For example, by comparing the phase of the received I and Q signals to each other the resulting phase information can be utilized to determine a correction to apply to achieve a desired level of image rejection.

The phase information may be used to reference a database, such as provided by a lookup table (not shown), to provide filter parameters for use in the Lattice all-pass filter shown in FIG. 6 to correct any detected phase tilt. For example, phase tilt versus frequency may be detected from a plot of the phase versus frequency resulting in a diagonal line. The foregoing phase offset calibration provided with respect to IQGD 531 facilitates operation of IQGD 532 at run-time to remove the effects of the above phase tilt to result in a constant phase offset between the I and Q channels across all frequencies.

Figure 7:
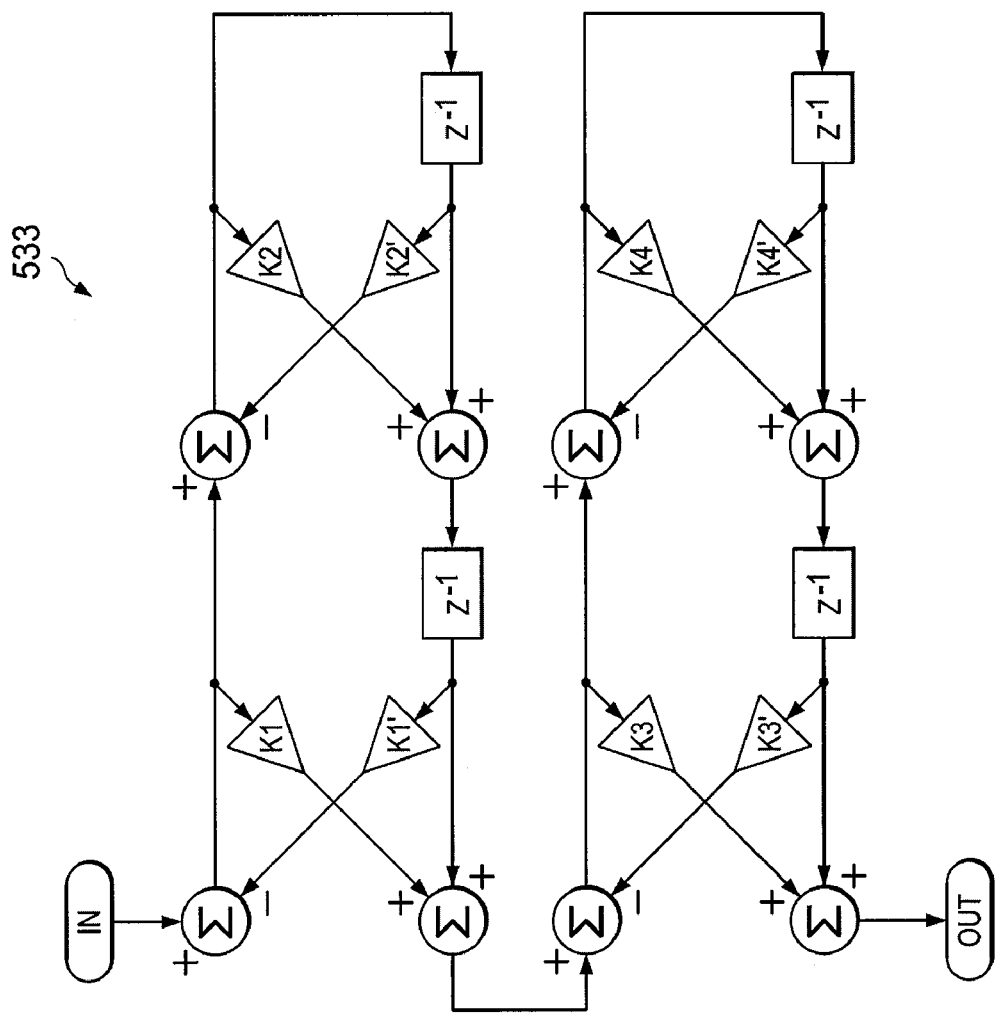
FIG. 7 shows detail with respect to an embodiment of an analog filter group delay compensation circuit of the in-phase and quadrature equalization circuit configurations shown in FIGS. 5A and 5B.

FIG. 7 shows detail with respect to an embodiment of AGD 533 of IQ equalization 330 illustrated in FIGS. 5A and 5B. AGD 533 of the illustrated embodiment performs group delay compensation with respect to the I and Q signal paths, such as to provide compensation due to the phase response of the baseband filters. In operation according to embodiments, AGD 533 is configured to implement filter coefficients as a function of the pole locations of the baseband filters to compensate for group delay introduced by the baseband filters. The desired frequency distortion to provide group delay correction is provided according to the embodiment illustrated in FIG. 7 using a four pole Lattice all-pass filter with two pairs of conjugate poles. The configuration of AGD 533 shown in FIG. 7 is capable of providing correction of as much as 150 ns of group delay non-linearity within the desired channel bandwidth with less than 10 ns of ripple (the ripple error is proportional to the amount of group delay correction provided). The Lattice filter configuration of the illustrated embodiment provides the foregoing phase distortion while substantially keeping the signal amplitude constant.

A calibration process is utilized according to embodiments to initialize AGD 533 to correct for group delay in the I and Q signal paths. In a calibration process of a preferred embodiment a resistor-capacitor (RC) calibration is performed to determine where the poles of the baseband filters are located. For example, the baseband filter may comprise a $7^{th}$ order Chebishev filter, having 7 poles associated therewith and the foregoing RC calibration may be utilized to provide information regarding where those poles are located.

Information regarding the baseband filter pole locations may be used to reference a database, such as provided by a lookup table (not shown), to provide filter parameters for use in the Lattice all-pass filter shown in FIG. 7 to correct group delay associated with the baseband filter. For example, the results of the RC calibration may be provided to an algorithm that calculates filter coefficients for AGD 533 to access a lookup table that comprises information regarding different sets of phase relationships or group delay curves. This information regarding group delay curves may be utilized by the algorithm to calculate the filter coefficients for AGD 533 for correcting the group delay introduced by the baseband filter. The foregoing group delay calibration provided with respect to AGD 533 facilitates operation of AGD 533 at run-time to remove the effects of the above group delay to result in a linear phase verses frequency relationship throughout the I and Q channels.

Figure 8A:
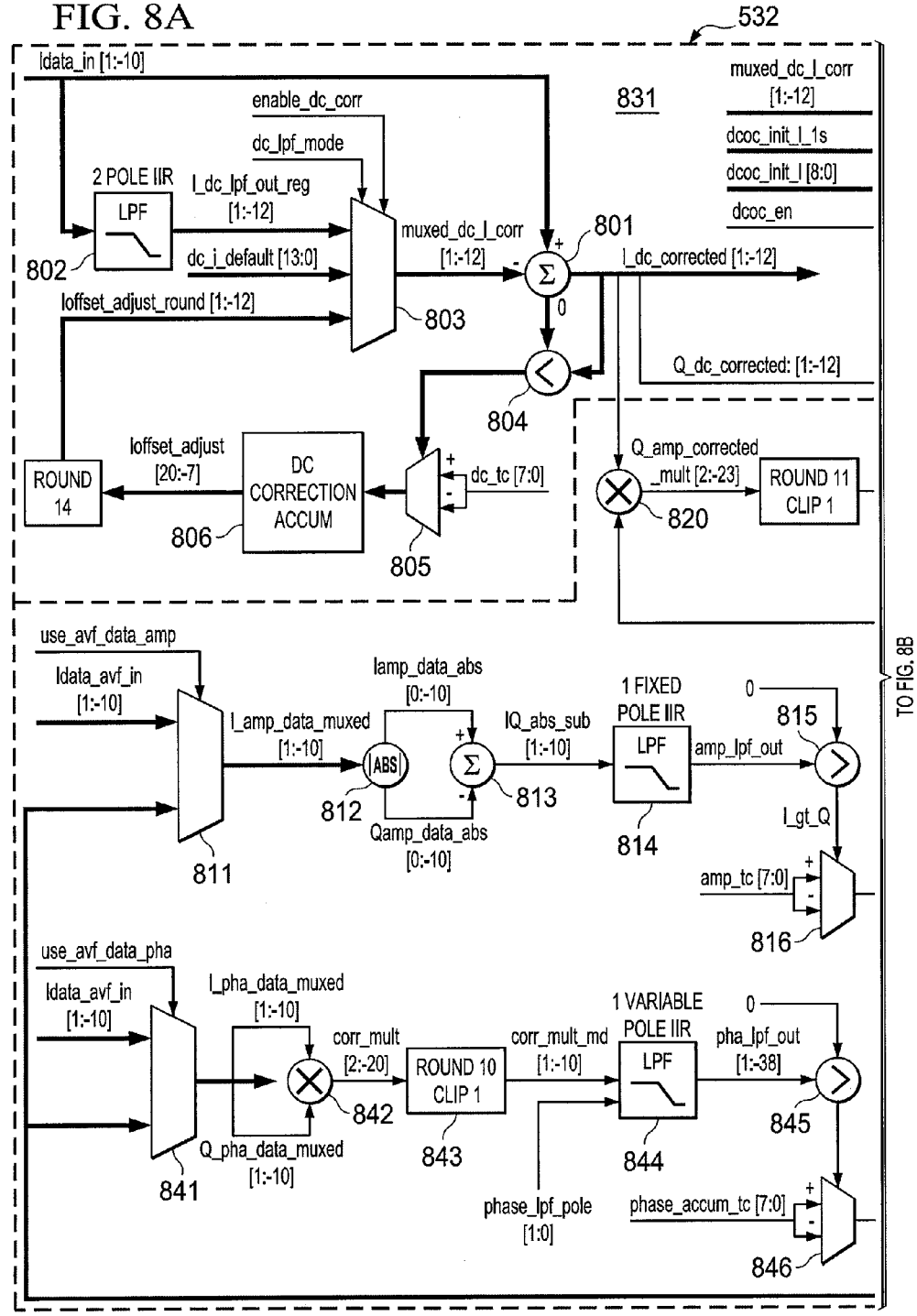
FIGS. 8A and 8B show detail with respect to an embodiment of the direct current offset correction and in-phase and quadrature equalization circuit illustrated in FIGS. 5A and 5B.
Figure 8B:
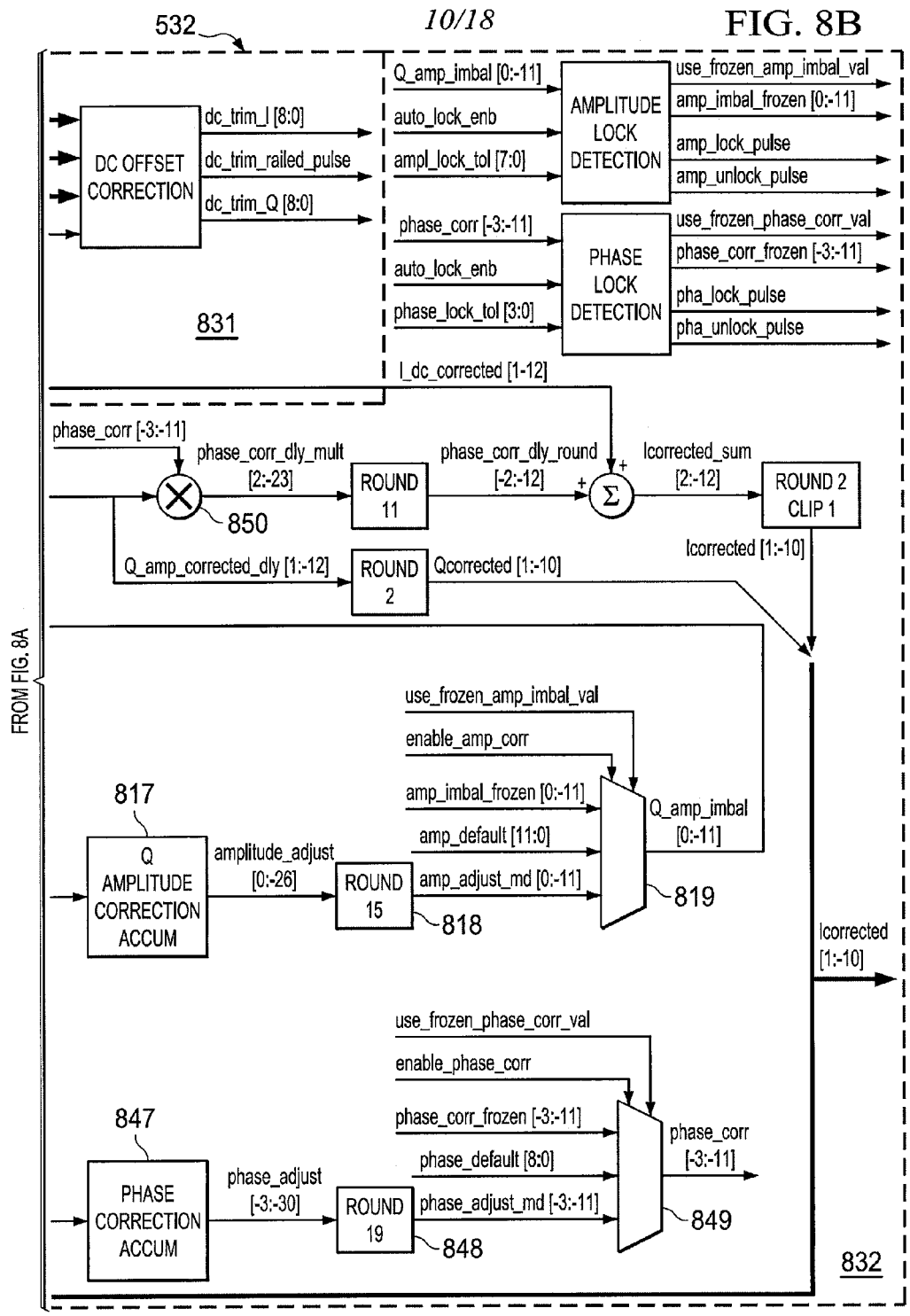

FIGS. 8A and 8B show detail with respect to an embodiment of IQE 532 of IQ equalization 330 illustrated in FIGS. 5A and 5B. IQE 532 of the illustrated embodiment performs DC correction and amplitude and phase imbalance correction with respect to the I and Q signals, such as to provide compensation due to mismatched components an other imperfections in the overall circuit. In operation according to embodiments, IQE 532 is configured to remove DC spur energy that is present on the I and Q signals. Moreover, IQE 532 of embodiments is configured to detect phase and amplitude error between the I and Q signals and, using feedback loops, apply correction based upon the detected error. The configuration of IQE 532 shown in FIGS. 8A and 8B is capable of providing DC correction in the full ADC range, such as through use of 9 bit signed magnitude feedback (minimum −255, maximum +255). Additionally, the configuration of IQE 532 shown in FIGS. 8A and 8B is capable of providing phase IQ imbalance correction with a phase resolution of 0.028° in a useful range of +/−2° (theoretical range of +/−7.16°) and amplitude IQ imbalance correction with a precision of 4.2 mdB to provide a minimum gain of −66 dB and a maximum gain of 6.01 dB. IQ equalization 330 of the illustrated embodiment operates to provide the foregoing IQ equalization techniques free-running or in run-time.

DC correction 831 of the embodiment of IQE 532 illustrated in FIGS. 8A and 8B provides correction of DC offset, such as may result from operation of direct conversion tuner 210. DC correction is provided according to preferred embodiments by two DC correction loops. As shown in the embodiments of FIGS. 8A and 8B, a DC correction feedback loop is provided for analog signals processed by the multimode direct conversion tuner architecture. Operation of an analog signal feedback loop of embodiments of the invention provides course, relatively slow moving DC offset correction. Additionally, a DC correction feedback loop is provided for digital signals processed by the multimode direct conversion tuner architecture. Operation of a digital signal feedback loop of embodiments of the invention provides fine, relatively fast moving DC offset correction. Such a two loop architecture enables better use of the dynamic range of the ADC to achieve better undesired signal to desired signal (U/D) ratios in the system.

The foregoing two DC correction loops of embodiments are operable regardless of whether analog or digital modulated signals are being processed. For example, the outer slow loop (the analog signal feedback loop) of embodiments employs an analog correction mechanism using digital control and detection. The inner loop (the digital signal feedback loop) of embodiments has a larger bandwidth and tracks faster changes of the DC or low frequency content of the signal. Thus, for the inner loop embodiments may use different DC offset techniques depending upon the type of signal being processed (analog or digital modulated signals).

A digital operational mode of embodiments of DC correction 831 provides a blind DC offset correction configuration, wherein blind operation is agnostic with respect to the nature of the moderated signal (e.g., the modulated signal is effectively considered noise in blind operation). Such a blind DC offset correction technique is particularly useful with respect to digital modulated signals such as advanced vestigial sideband modulation (A-VSB), quadrature amplitude modulation (QAM), digital video broadcasting (DVB), etc.

Blind DC offset correction operation according the illustrated embodiment operates to sample the I and Q signals and to collect information regarding the number of samples which are positive and the number of samples which are negative to create a first order, coarse feedback control loop to correct DC offset into the signal. Comparator 804 of the illustrated embodiment is configured as a zero-crossing detector to provide a signal indicating detection of positive and negative samples. This signal is provided to multiplexer 805 of the illustrated embodiment to select a corresponding count signal for providing to DC correction accumulator 806. If operation of DC correction accumulator 806 indicates that more samples are positive than negative in a sampling window, it may be determined that a positive DC offset is present and thus an appropriate negative DC correction signal is provided through multiplexer 803 for summing with the signal being processed by summer 801. However, if operation of DC correction accumulator 806 indicates that more samples are negative than positive in a sampling window, it may be determined that a negative DC offset is present and thus an appropriate positive DC correction signal is provided through multiplexer 803 for summing with the signal being processed by summer 801. An appropriate DC offset correction may thus be provided to mitigate the detected DC offset. The DC offset correction amplitude may be determined by analyzing the most significant bits (MSBs) of the DC error in the correction accumulator. The DC compensation feedback of embodiments will converge once the resulting DC error is minimized. The loop dynamics are controlled according to embodiments via a time constant applied to the measured DC error before accumulation. Where the positive and negative samples are within a threshold range of one another, it may be determined that no DC offset (or sufficiently low DC offset) is present.

An analog operational mode of embodiments of DC correction 831 provides a DC low-pass filter configuration. The illustrated embodiment provides 2 pole infinite impulse response (IIR) low-pass filter (LPF) 802 to provide DC detection. In the analog operational mode, multiplexer 803 provides the detected DC offset signal to summer 801 for subtracting the detected DC offset from the signal being processed. An appropriate DC offset correction may thus be provided to mitigate the detected DC offset.

Additionally or alternatively, embodiments of the invention may implement a video content adaptive DC offset compensation algorithm. For example, DCOC and IQ equalizer 332 of embodiments operates to detect appropriate parts of the signal being processed for accurate and signal independent DC and low-frequency spur estimation. Depending upon signal condition, DCOC and IQ equalizer 332 may use an unassisted detection mode, a mode where detection is gated by demodulator 350, a blind mode (unassisted and open detection), etc. The use of such various detection modes allow the DC correction to be optimal in all operating conditions.

Amplitude and phase correction 832 of the embodiment of IQE 532 illustrated in FIGS. 8A and 8B provides correction of amplitude and phase imbalance with respect to the I and Q signals, such as may result from component mismatch, circuit imperfections, etc. Amplitude correction is provided according to preferred embodiments by comparing signal amplitudes of corresponding I and Q signals and providing amplitude correction with respect to one such signal (e.g., Q amplitude correction) in relation to a detected imbalance. Phase correction is provided according to preferred embodiments by comparing the relative phase of corresponding I and Q signals and providing phase correction in relation to a detected imbalance.

It should be appreciated that phase correction provided by the embodiment illustrated in FIGS. 8A and 8B operates with respect to the signal after having been processed by the channel filter. That is, the phase detection of embodiments is performed with respect to the channel filtered data, although the resulting phase correction is performed with respect to the signal prior to the channel filter. In other words, to make a determination regarding phase imbalance embodiments operate to analyze the channel filtered and automatically frequency offset corrected (AFC'd) data to determine the phase imbalance of the desired signal (it being appreciated that the desired signal will always be within the bandwidth of the channel filter) because the undesired signal (outside of the channel filter bandwidth) will significantly bias the phase imbalance detection.

As discussed above, embodiments of the invention provide for shifting of the signal in the frequency domain, such as in association with the above described group delay distortion correction. A goal of such a frequency shift is to align the desired signal with the channel filter so that optimal undesired signal rejection can be achieved. Such a frequency shift, if not otherwise accounted for, may bias phase estimations. Accordingly, embodiments of the implement frequency tracking to detect such desired frequency shifts in the phase correction determination and thereby provide phase correction accommodating additional signal phase processing provided by the multimode direct conversion tuner architecture. The embodiment illustrated in FIGS. 5A and 5B the output of IQ equalization 330, which as been frequency shifted for group delay correction, is provided to zero rotator circuit 550 to provide frequency tracking feedback to amplitude and phase correction 832 of IQE 532. Automatic frequency control (AFC) numerical controlled oscillator (NCO) 551 of zero rotator circuit 550 may be used with a frequency control signal provided by the analog demodulator (shown in FIG. 3B as demodulator 350) to adjust the signals being processed by the phase correction circuitry of amplitude and phase correction 832 to account for the group delay correction phase shift (e.g., shift the phase back to the un-phase corrected state).

Elements 811-820 shown in the illustrated embodiment of amplitude and phase correction 832 cooperate to provide the aforementioned amplitude correction. Amplitude imbalance detection of embodiments is performed after and independently from DC correction. In operation according to embodiments, the amplitude of the imaginary part (I) and real part (Q) of the signal as provided by multiplexer 811 are compared to each other using absolute value 812 and summer 813 to generate an error signal. This error signal is preferably accumulated in a first order integrated loop (shown as comprising low pass filter 814, comparitor 815, multiplexer 816, accumulator 817, and round 818) for generating an amplitude imbalance measurement. For a perfectly balanced measurement these comparison errors exactly integrated to 0. If, however, the imaginary part (I) has a positive amplitude imbalance (i.e., the amplitude of I is greater than Q) the accumulator will integrate to a value proportional to the imbalance and vice versa. This resulting value is provided to amplitude correct the signal being processed via multiplexer 819 and mixer 820.

Elements 841-850 shown in the illustrated embodiment of amplitude and phase correction 832 cooperate to provide the aforementioned phase correction. In operation according to embodiments, the phase of the imaginary part (I) and real part (Q) of the signal as provided by multiplexer 841 are compared to each other using mixer 842 to generate an error signal. This error signal is preferably accumulated in a first order integrated loop (shown as comprising round 843, low pass filter 844, comparitor 845, multiplexer 846, accumulator 847, and round 848) for generating a phase imbalance measurement. For a perfectly balanced measurement these comparison errors exactly integrated to 0. If, however, the imaginary part (I) has a positive phase imbalance (i.e., the phase of I is advanced with respect to Q) the accumulator will integrate to a value proportional to the imbalance and vice versa. This resulting value is provided to phase correct the signal being processed via multiplexer 849 and mixer 850.

In operation according to embodiments, a simple first order trigonometric projection is used for the compensation application of the detected amplitude and phase imbalances. By using such a projection embodiments operate to cancel out of the I path the image of the Q signal, effectively separating the true I and Q components of the signal.

As can be seen from the foregoing, IQ equalization 330 of embodiments of the invention operates to provide mitigation of DC offset, group delay, amplitude imbalances, and phase imbalances. Embodiments implement IQ equalization 330 with respect to analog demodulation functionality and digital IF functionality of a multimode tuner architecture, as described below.

Referring again to FIGS. 3A and 3B, the illustrated embodiment of multimode direct conversion tuner architecture 200 includes multimode channelization filter architecture 340 in digital baseband processing 230 to provide a filter configuration adapted to accommodate both analog broadcast signal processing and digital broadcast signal processing. Channelization filter architecture 340 of embodiments accommodates a plurality of analog and digital broadcast standards. Such a multimode channelization filter architecture of an embodiment comprises a channel filter adapted to provide multimode signal processing operation and a vestigial filter provided for use with respect to signals after carrier and phase recovery.

Channelization filter architecture 340 of embodiments provides an integrated circuit implementation of a channel filter operable to provide selection of a desired channel signal and an integrated circuit implementation of a vestige filter operable upon the signal after carrier and phase recovery. The channelization filter architecture of embodiments accommodates both analog and digital broadcast standards without the need for notch filters typically used to provide separation of audio and video signals.

Additional detail with respect to embodiments of multimode channelization filter architecture 340 is shown in FIGS. 5A and 5B. Sub-band processing is provided in 2 stages of adjacent channel interferer (ACI) filtering with additional filtering for IF generation and DAC up-sampling is provided according to embodiments. Accordingly, the illustrated embodiments of multimode channelization filter architecture 340 include a plurality of filter blocks, shown as image reject filter (IRF) 521, audio video separation filter (AVF) 522, vestigial side band filter (VSB) filter 523, and up-sampling and cascaded integrator comb (USD/CIC) filter 524. The foregoing filters are preferably linear phase with controlled ripple in the pass-band. The filtering architecture of preferred embodiments accommodates a channel bandwidth of 8 MHz (e.g., for processing signals conforming to different standards, such as NTSC, PAL, etc.) and a variable IQ ADC sampling rate (e.g., to facilitate spur avoidance operation as described above).

IRF 521 of embodiments is configured the same regardless of whether analog or digital broadcast signals are being processed. IRF 521 preferably operates to filter out the remainder of adjacent channels remaining after processing by direct conversion tuner 210 and to provide decimation to reduce the sampling rate of the signal being processed, while maintaining the noise figure of the signal content. Such decimation may operate to increase the sampling rate to system clock ratio. Accordingly, decimation provided by IRF 521 may be utilized to reduce the sampling rate for efficient implementation of subsequent signal processing, such as for efficient implementation of AVF 522.

An embodiment of IRF 521 is implemented as a linear phase finite impulse response filter (FIR) operable as a half band decimator. IRF 521 of embodiments comprises a 25 taps linear phase FIR filter, for example. Adaptive fixed point format output, using digital automatic gain control (AGC) information for optimal data path width usage, is provided by IRF 521 of embodiments of the invention. For example, IRF 521 may comprise a 12 bit input data path and a 12 bit output data path and provide 2 bits full resolution AGC gain control (/2 to *4) on full precision internal calculations. Filter coefficients (e.g., 13 or 14 bit filter coefficients) for IRF 521 may be stored in an array of latches or other memory accessible through a control network, such as an inter-integrated circuit ($I^2C$ system).

Figure 9A:
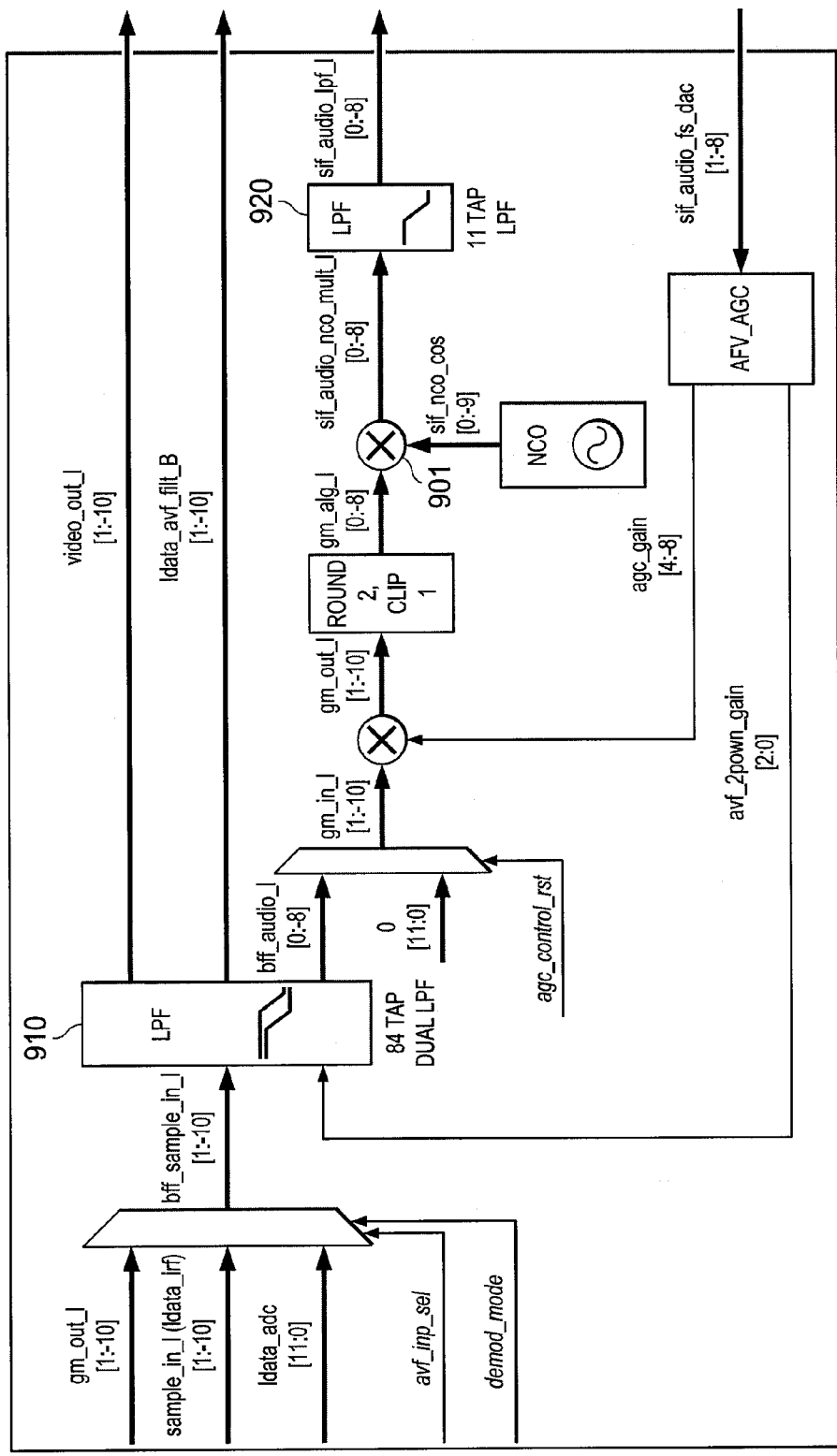
FIGS. 9A and 9B show detail with respect to embodiments of the audio video separation filter circuit illustrated in FIGS. 5A and 5B.

AVF 522 of embodiments is configured differently depending upon whether analog or digital broadcast signals are being processed, the particular broadcast signal standard, the sampling frequency, and/or the particular desired. Accordingly, AVF 522 is preferably adapted for configuration to all of the foregoing conditions for both analog and digital signals. In analog mode (configured to process analog broadcast signals), as shown in FIG. 9A, embodiments of AVF 522 effectively operate as two filters, wherein a first such filter (LPF 910) removes adjacent channels (e.g., N+/−1 adjacent channels) and a second such filter (LPF 920) performs audio/video separation. In digital mode (configured to process digital broadcast signals), as shown in FIG. 9B, embodiments of AVF 522 effectively operates as a filter (LPF 910) to provide removal of adjacent channels (e.g., N+/−1 adjacent channels).

Filter coefficients for AVF 522 (e.g., for configuring LPF 910 and LPF 920) optimized for the different standards and different frequencies processed by multimode direct conversion tuner architecture 200 are stored, such as in registers or other memory, for configuring filters of AVF 522 appropriately for a signal being processed. The filter coefficients for AVF 522 are preferably loaded from the aforementioned memory, such as through the use of a control network such as may comprise an $I^2C$ system, to configure AVF 522 for its different operating modes. Embodiments of the invention implement 4 different digital filter types (e.g., corresponding to ATSC, DVB-T, ISDB-T, and DTMB digital broadcast standards) and 3 different analog filter types (e.g., corresponding to analog broadcast standards of systems M/N/B/G/H/D/K, I, and L) to accommodate the different broadcast signals to be processed by multimode direct conversion tuner architecture 200.

Figure 9B:
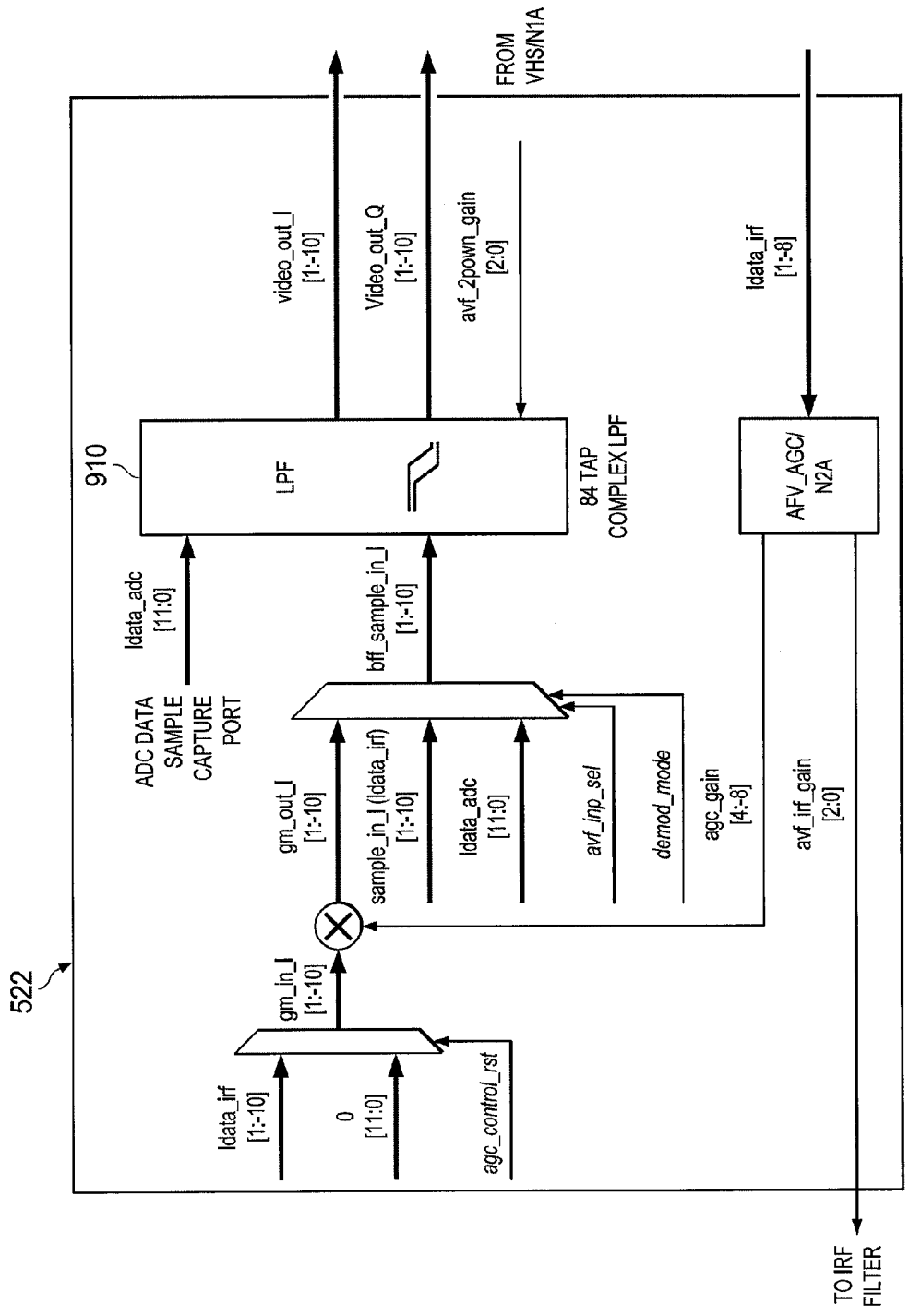

Embodiments of AVF 522 shown in FIGS. 9A and 9B comprise a relatively large low-pass filter, shown as LPF 910, providing sharp transitions and implementing oversampling (e.g., 16 times oversampling). For example, LPF 910 may comprise an 84 tap complex low-pass filter using 14, 9, or 7 bits pyramid-quantized coefficients. Adaptive fixed point format output, using video clamping AGC information for optimal data path width usage, is provided by AVF 522 of embodiments of the invention. Thus, LPF 910 of embodiments operates on complex data using dual real coefficient filters to provide multiple outputs.

As can be seen in FIG. 9A, AFV 522 operating in an analog mode provides video output, overall channel output including video and audio, and audio output in analog mode. The video output provided by LPF 910 of embodiments is provided directly to the video synchronous demodulator while the overall channel output is utilized for IQ equalization as discussed above. Additional processing is provided by AFV 522 with respect to the audio output to create sound IF audio. Specifically, the illustrated embodiment utilizes a down mixer (shown as mixer 901) and low-pass filter (shown as LPF 920, wherein LPF 920 may comprise an 11 tap complex low-pass filter), to remove the image associated with the audio/video separation and filtering and provide sound IF.

Figure 10A:
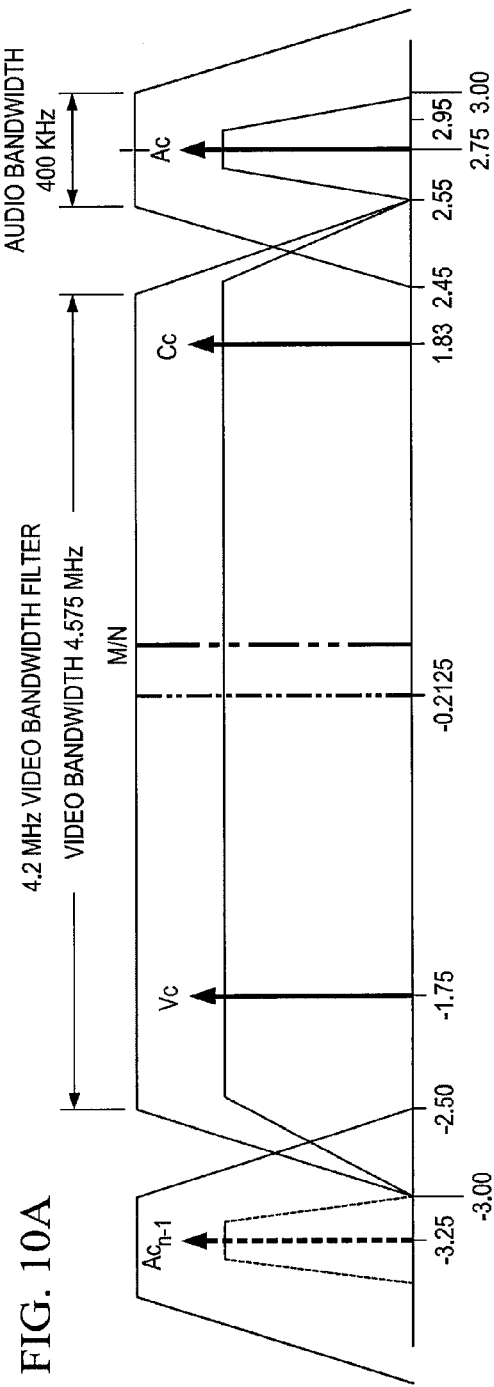
Figure 10B:
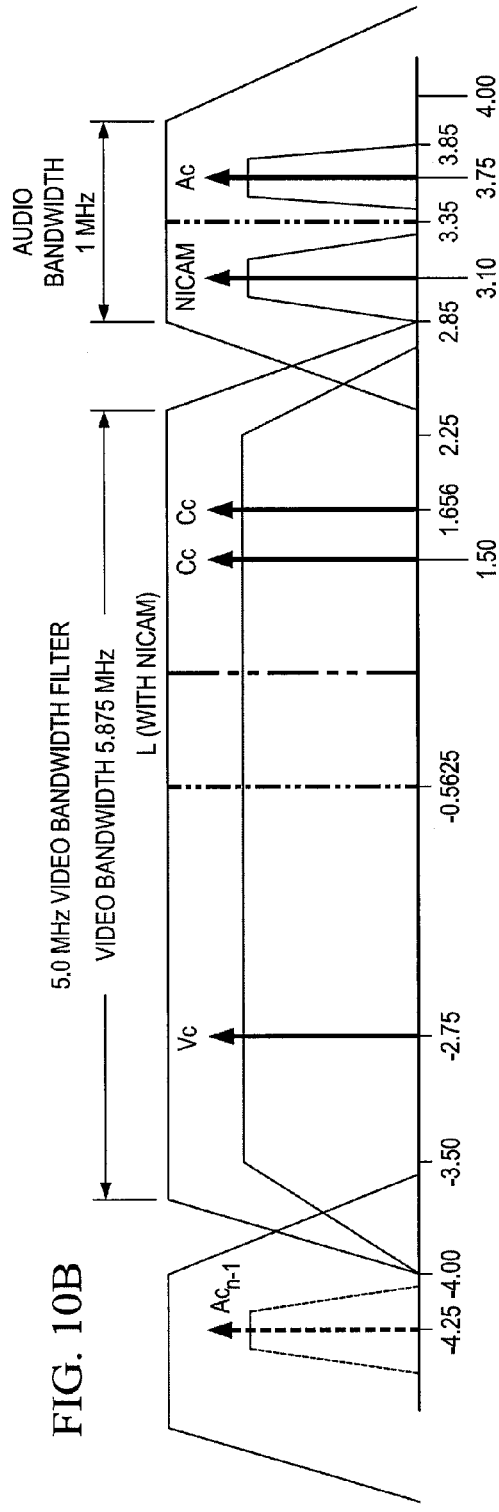
Figure 10E:
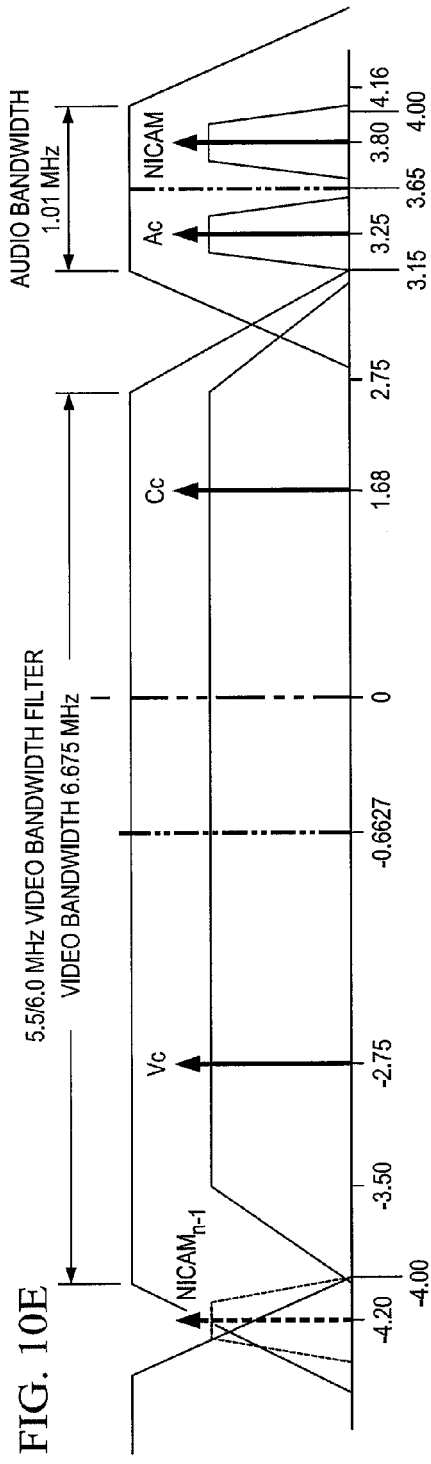
Figure 10F:
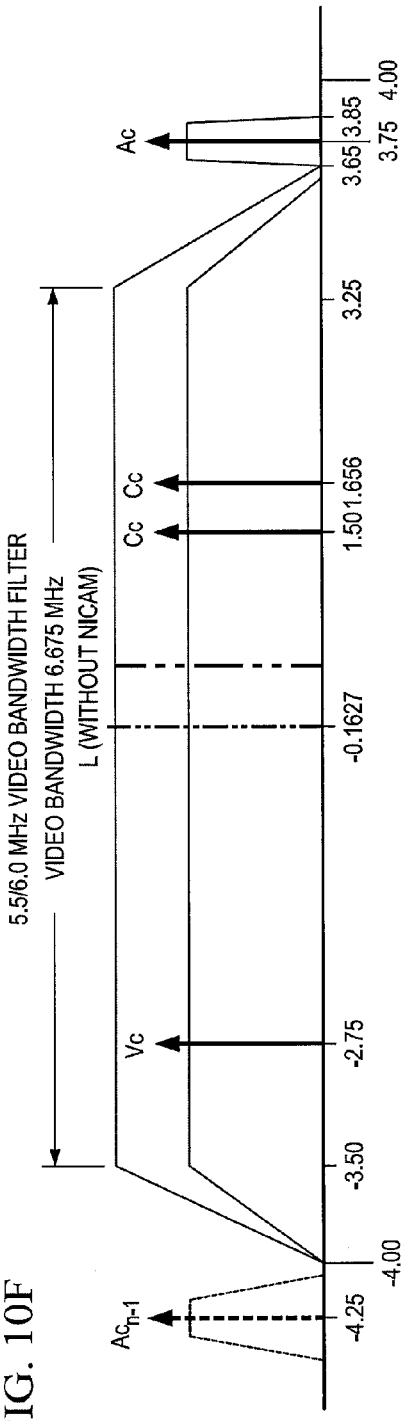
Figure 10G:
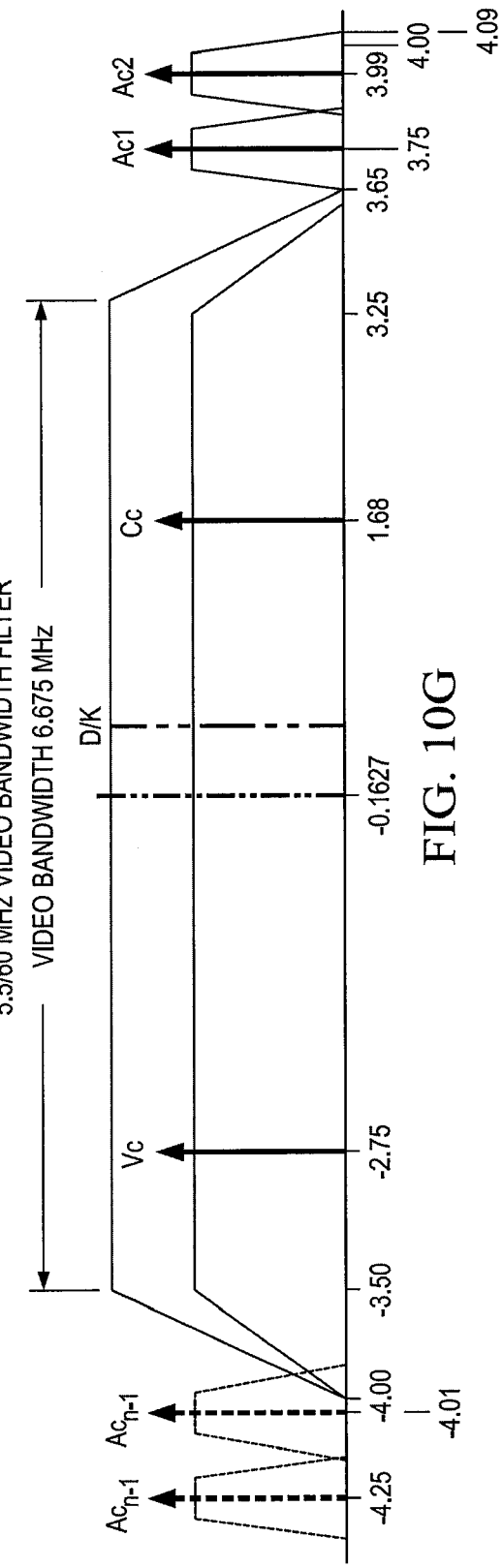
Figure 11A:
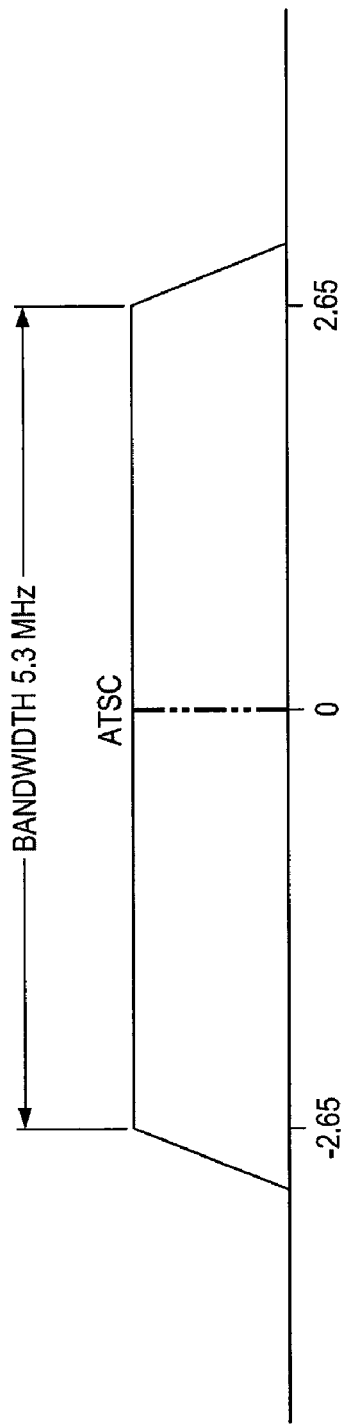
FIGS. 11A-11D show configurations of the audio video separation filters of FIGS. 9A and 9B adapted for use with respect to signals of different digital standards.
Figure 11B:
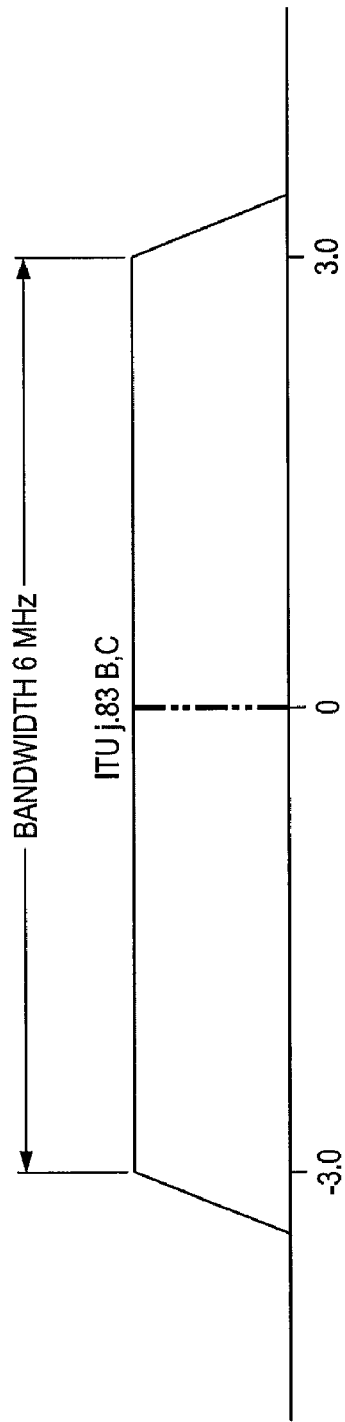
Figure 11C:
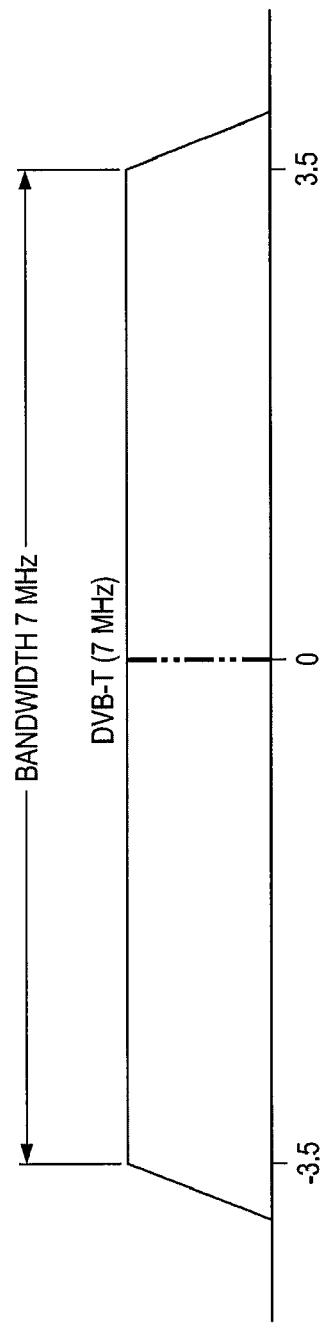
Figure 11D:
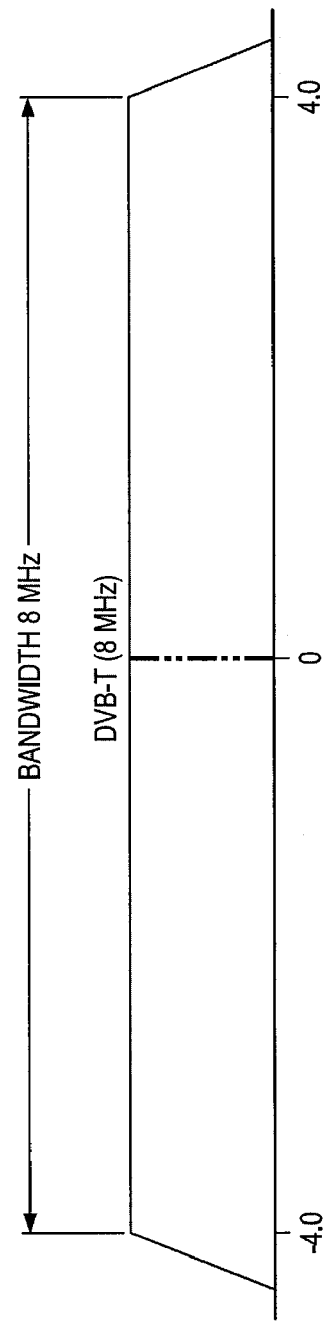

FIGS. 10A-10F show configurations of AFV 522 adapted for use with respect to different analog standards. For example, the filter configuration of FIG. 10A, providing a 4.2 MHz video bandwidth filter and a 400 KHz audio bandwidth filter, is adapted for M/N standards. The filter configurations of FIGS. 10B-10D, providing a 5.0 MHz video bandwidth filter and a 1 MHz audio bandwidth filter, are adapted for L (with NICAM), G/H, and B standards, respectively. The filter configurations of FIGS. 10E-10G, providing a 5.5/6.0 MHz video bandwidth filter and a 1.01 MHz audio bandwidth filter, are adapted for I, L (without NICAM), and D/K standards, respectively. It can be seen in the embodiments illustrated in FIGS. 10A-10G that frequency offsets are provided in the digital domain to center the filters properly to the standards. Accordingly, multimode operation as provided by multimode direct conversion tuner architecture 200 of embodiments is enabled using the aforementioned blind equalization, but also through the use of predetermined filter frequency offsets for use with particular standards.

As can be further seen in FIG. 9B, AFV 522 operating in a digital mode provides output of the digital data signal for the desired channel. FIGS. 11A-11D show a configuration of AFV 522 adapted for use with respect to different digital standards. For example, the filter configuration of FIG. 11A, providing a 5.3 MHz bandwidth, is adapted for ATSC standards. The filter configuration of FIG. 11B, providing a 6 MHz bandwidth, is adapted for ITU j.83 standards. The filter configurations of FIGS. 11C and 11D, providing 7 MHz and 8 MHz bandwidths respectively, are adapted for DVB-T standards. Accordingly, multimode operation as provided by multimode direct conversion tuner architecture 200 of embodiments.

As previously mentioned, embodiments of multimode direct conversion tuner architecture 200 are implemented upon a single integrated circuit substrate. Accordingly, die area available for any particular portion of the architecture is limited. Embodiments of AVF 522, although providing implementing a relatively large filter for audio and video separation (LPF 910), comprise an efficient configuration to conserve die area.

For example, although low-pass filter functionality is used for separating the audio portion of the signal from the rest of the signal and band-pass filter functionality is used for separating the video portion of the signal from the rest of the signal, embodiments implement resource sharing to provide this functionality. Accordingly, rather than provide the delay lines to provide a band-pass filter with sharp cutoffs (e.g., a 78 tap band-pass filter) and the delay lines to provide a low-pass filter with a sharp cutoff (e.g., a 78 tap low-pass filter), embodiments implement a configuration in which a first low-pass filter filters off the video, and a second low-pass filter which has a slightly larger pass-band is used in combination with the first low-pass filter to generate the band-pass filter functionality. That is, embodiments operate to subtract the first filter characteristic from the second filter characteristic to generate a band-pass characteristic. Embodiments of the invention use the delay lines from the first filter to implement the second filter. Thus, rather than implementing three separate, relatively large filters to accomplish the foregoing signal separation, embodiments of the invention provide a single filter configuration (e.g., LPF 910 of the illustrated embodiment), using additional multipliers, to accomplish audio and video separation using relatively little die area.

VSB 523 of embodiments is configured differently depending upon whether analog or digital broadcast signals are being processed, the particular broadcast signal standard, the sampling frequency, and/or the particular desired. Accordingly, VSB 523 is preferably adapted for configuration to all of the foregoing conditions for both analog and digital signals. In analog mode (configured to process analog broadcast signals), embodiments of VSB 523 is configured as a complex filter performing VSB removal and additional adjacent channel removal. In digital mode (configured to process digital broadcast signals), embodiments of VSB 522 operates to provide peaking for the compensation of passband roll-off introduced by subsequent filtering (e.g., subsequent CIC filtering).

It should be appreciated that the vestigial sideband removal as provided by embodiments of VSB 523 in analog mode is contrary to traditional architectures. Usually vestigial sideband removal is performed before demodulation, resulting in a considerably less powerful carrier signal (e.g., a carrier which is 6 dB less powerful) being provided to a synchronous demodulator. However, the illustrated embodiment of multimode direct conversion tuner architecture 200 provides analog demodulation in the complex domain and the VSB removal provided by VSB 523 is provided after demodulation, thus resulting in no carrier power reduction associated with a VSB filter prior to demodulation. This configuration provides better reliability with respect to carrier acquisition. Moreover, the illustrated embodiment uses both the I and Q signal components from the demodulator in VSB removal, combining the residual energy of the Q signal path into the filter in order to obtain better chromatic response.

USD_CIC 524 of embodiments provides signal up sampling using a CIC type architecture. In analog mode USD_CIC 524 may up sample the baseband video to the DAC clock and up sample the audio to the DAC clock/2. In digital mode USD_CIC 524 may up sample a complex signal to the DAC clock.

VSB 523 of embodiments pre-compensates for USD_CIC 524 to control the pass-band flatness of channelization filter architecture 340. For example, in addition to providing removal of up sampling image, VSB 523 operating in digital mode may provide compensation of the pass-band roll-off introduced by USD_CIC 524, such that cascading these filters maintains a constant frequency response through the filter chain.

A digital mode of channelization filter architecture 340 according to embodiments of the invention comprises a filter providing DAC aperture correction. For example, DAC aperture correction filter 525 (FIG. 5B) of embodiments provides compensation for the DAC frequency response in the digital domain to control the frequency slop inside the 6 or 8 MHz bandwidth at any IF. DAC aperture correction filter 525 of embodiments compensates for the sample and hold frequency response of the DAC for digital modulation standards, wherein the compensation is applied across the desired channel bandwidth. Embodiments of DAC aperture correction filter 525 comprise a 3 tap FIR filter configuration operating at IF frequency (real signal) in the range of 4 to 54 MHz.

The foregoing filter architecture provides for multimode operation, accommodating both analog and digital broadcast signal processing. Moreover, the filter architecture according to embodiments provides operation within digital baseband processing 230 when processing analog broadcast signals which emulates analog tuner operation. For example, the overall filter architecture of embodiments is adapted to maintain the clock relationships between the ADC sampling clock and the DAC clock although, as described above, the ADC sampling clock of embodiments is variable.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A low noise amplifier comprising:
  a high linearity path having a first adjustable gain amplifier configured for highly linear operation;
  a low noise path having a second adjustable gain amplifier configured for low noise performance; and
  a control circuit configured to control contribution to a signal output by the low noise amplifier by adjusting one or more of the adjustable gain amplifiers of the high linearity path and the low noise path,
  wherein the control circuit is configured to increase the contribution to the signal output by the low noise amplifier by the low noise path and to decrease the contribution to the signal output by the low noise amplifier by the high linearity path as a gain of the low noise amplifier is increased.

2. The low noise amplifier of claim 1, wherein the control circuit is configured to increase a gain of the high linearity path up to a selected highest gain setting and thereafter to increase a gain of the low noise path as the gain of the low noise amplifier is increased.

3. The low noise amplifier of claim 1, wherein the control circuit is configured to increase the contribution to the signal output by the low noise amplifier by the high linearity path and to decrease the contribution to the signal output by the low noise amplifier by the low noise path as a gain of the low noise amplifier is decreased.

4. The low noise amplifier of claim 3, wherein the control circuit is configured to decrease a gain of the low noise path down to a selected lowest gain setting and thereafter to decrease a gain of the high linearity path as the gain of the low noise amplifier is decreased.

5. The low noise amplifier of claim 1, wherein the control circuit comprises:
  bias current control circuitry configured to inversely control an amount of bias current provided to the first adjustable gain amplifier and the second adjustable gain amplifier to thereby control the contribution to the signal output by the low noise amplifier by the high linearity path and the low noise path.

6. A method comprising:
  providing a low noise amplifier having a high linearity path and a low noise path disposed in parallel;
  controlling the high linearity path and the low noise path to cooperatively provide an output signal of the low noise amplifier;
  increasing a contribution to the output signal by the high linearity path as a gain of the low noise amplifier is decreased; and
  decreasing a contribution to the output signal the low noise path as the gain of the low noise amplifier is decreased.

7. The method of claim 6, wherein the controlling comprises:
  increasing a contribution to the output signal by the low noise path as a gain of the low noise amplifier is increased; and
  decreasing the contribution to the output signal by the high linearity path as the gain of the low noise amplifier is increased.

8. The method of claim 7, wherein the controlling comprises:
  increasing a gain of the high linearity path up to a selected highest gain setting as a gain of the low noise amplifier is increased and thereafter increasing a gain of the low noise path as the gain of the low noise amplifier is increased.

9. The method of claim 6, wherein the controlling comprises:
  decreasing a gain of the low noise path down to a selected lowest gain setting as a gain of the low noise amplifier is decreased and thereafter to decrease a gain of the high linearity path as the gain of the low noise amplifier is decreased.

10. The method of claim 6, wherein the controlling comprises:
  inversely controlling an amount of bias current provided to an adjustable gain amplifier of the high linearity path and an adjustable gain amplifier of the low noise path to thereby control a contribution to the output signal by the high linearity path and the low noise path.

11. A system comprising:
  a high linearity path having a first adjustable gain amplifier configured for highly linear operation;
  a low noise path having a second adjustable gain amplifier configured for low noise performance; and
  a control circuit configured to control contribution to a signal output by the system from operation of the high linearity path and the low noise path through inversely controlling an amount of bias current provided to the first adjustable gain amplifier and the second adjustable gain amplifier,
  wherein the high linearity path and the low noise path form at least a portion of a low noise amplifier circuit; and
  wherein the control circuit is configured to increase the contribution to the signal output by the low noise amplifier by the high linearity path and to decrease the contribution to the signal output by the low noise amplifier by the low noise path as a gain of the low noise amplifier is decreased.

12. The system of claim 11, wherein the control circuit is configured to increase the contribution to the signal output by the low noise amplifier by the low noise path and to decrease the contribution to the signal output by the low noise amplifier by the high linearity path as a gain of the low noise amplifier is increased.

13. The system of claim 12, wherein the control circuit is configured to increase a gain of the high linearity path up to a selected highest gain setting and thereafter to increase a gain of the low noise path as the gain of the low noise amplifier is increased.

14. The system of claim 11, wherein the control circuit is configured to decrease a gain of the low noise path down to a selected lowest gain setting and thereafter to decrease a gain of the high linearity path as the gain of the low noise amplifier is decreased.

15. The low noise amplifier of claim 1, wherein the control circuit is further configured to decrease a gain of the linearity path and a gain of the low noise path as a gain of the low noise amplifier is decreased.

16. The system of claim 11, wherein the control circuit is further configured to decrease a gain of the linearity path and a gain of the low noise path as a gain of the low noise amplifier is decreased.

* * * * *